US008446148B2

(12) United States Patent
Rehwald et al.

(10) Patent No.: US 8,446,148 B2
(45) Date of Patent: May 21, 2013

(54) LONG T1 ARTIFACT SUPPRESSION TECHNIQUES FOR MAGNETIC RESONANCE IMAGING

(75) Inventors: Wolfgang Gerhard Rehwald, Chapel Hill, NC (US); Enn-Ling Chen, Chapel Hill, NC (US); Raymond J. Kim, Chapel Hill, NC (US)

(73) Assignees: Siemens Medical Solutions USA, Inc., Malvern, PA (US); Duke University, Durham, NC (US)

( * ) Notice: Subject to any disclaimer, the term of this patent is extended or adjusted under 35 U.S.C. 154(b) by 501 days.

(21) Appl. No.: 12/548,467

(22) Filed: Aug. 27, 2009

(65) Prior Publication Data

US 2010/0219829 A1 Sep. 2, 2010

Related U.S. Application Data

(60) Provisional application No. 61/092,881, filed on Aug. 29, 2008.

(51) Int. Cl.
*G01V 3/00* (2006.01)

(52) U.S. Cl.
USPC ........................................................ 324/309

(58) Field of Classification Search
USPC ................................. 324/300–322
See application file for complete search history.

(56) References Cited

U.S. PATENT DOCUMENTS

| 6,192,263 | B1 * | 2/2001 | Ma | 600/410 |
|---|---|---|---|---|
| 7,227,359 | B2 * | 6/2007 | Ma | 324/309 |
| 7,627,360 | B2 * | 12/2009 | Kimura | 600/419 |
| 7,684,847 | B2 * | 3/2010 | Itagaki et al. | 600/413 |
| 7,990,140 | B2 * | 8/2011 | Sugiura | 324/307 |
| 2002/0167317 | A1 | 11/2002 | Shenoy et al. | |
| 2004/0051527 | A1 | 3/2004 | Mugler, III et al. | |
| 2009/0027051 | A1 | 1/2009 | Stuber et al. | |

FOREIGN PATENT DOCUMENTS

| JP | 1076842 A | 3/1989 |
|---|---|---|
| JP | 2008136851 A | 6/2008 |

OTHER PUBLICATIONS

Saremi, Farhood, et al., "Optimizing Cardiac MR Imaging: Practical Remedies for Artifacts," RadioGraphics, 28:1161-1187 (2008).
Rehwald, Wolfgang G., et al., "Elimination of ghosting artifacts originating from body fluids with long T1 values in segmented ECG-gated IR-prepared sequences," Journal of Cardiovascular Magnetic Resonance, 10(Suppl 1):A264 (2008).
Rehwald, et al., "Meeting abstract, Journal of Cardiovascular Magnetic Resonance Meeting abstracts," http://www.biomedcentral.com/content/pdf/1532-429X-10-S1-info.pdf Los Angeles, CA, USA (Feb. 1-3, 2008).
Kellman, Peter et al., "Artifact Suppression in Delayed Hyperenhancement Imaging of Myocardial Infarction using B1-weighted Phased Array Combined Phase Sensitive Inversion Recovery," Magnetic Resonance in Medicine 51:408 (2004).

* cited by examiner

*Primary Examiner* — Dixomara Vargas
(74) *Attorney, Agent, or Firm* — Nixon & Vanderhye P.C.

(57) ABSTRACT

A method of suppressing artifacts arising from tissue, fluids, or other long-T1 species when acquiring magnetic resonance data with a segmented pulse sequence that assumes that magnetization is at steady state, said method including suppressing artifacts by producing an artifact suppression module (ASM) before the segmented sequence, the artifact suppression module comprising at least one selective, non-selective, or volume-selective suppression pulse and a time delay.

43 Claims, 22 Drawing Sheets

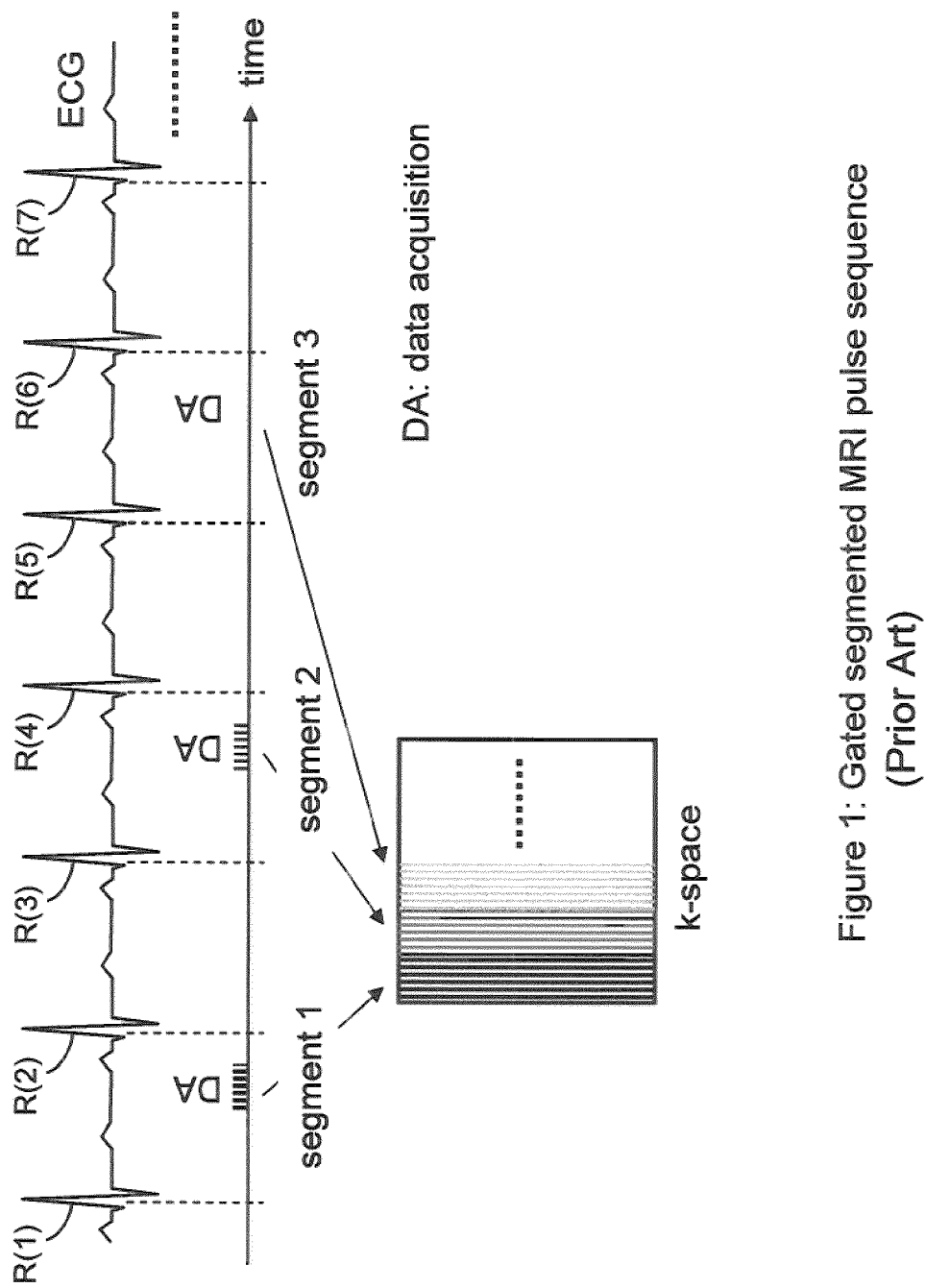
Figure 1: Gated segmented MRI pulse sequence
(Prior Art)

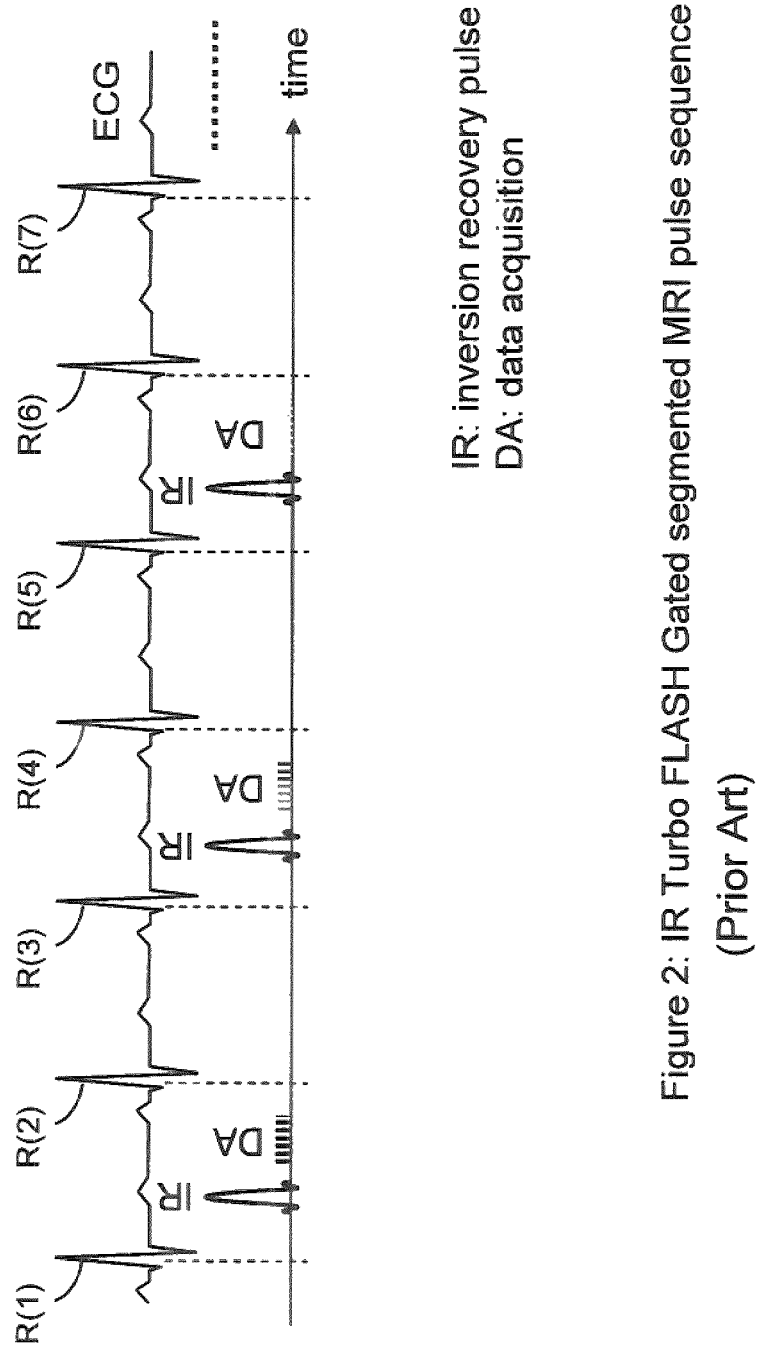
Figure 2: IR Turbo FLASH Gated segmented MRI pulse sequence (Prior Art)

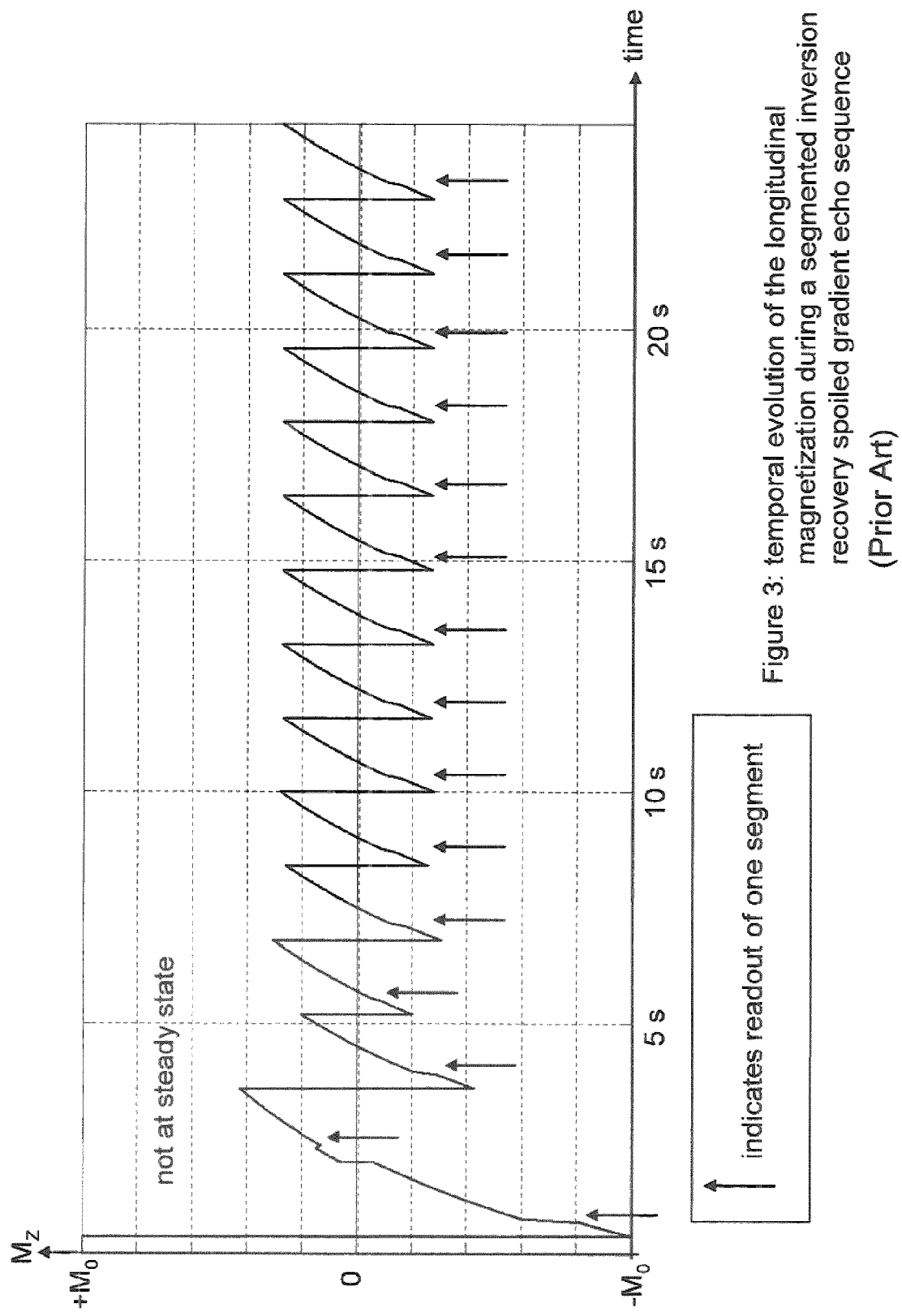
Figure 3: temporal evolution of the longitudinal magnetization during a segmented inversion recovery spoiled gradient echo sequence (Prior Art)

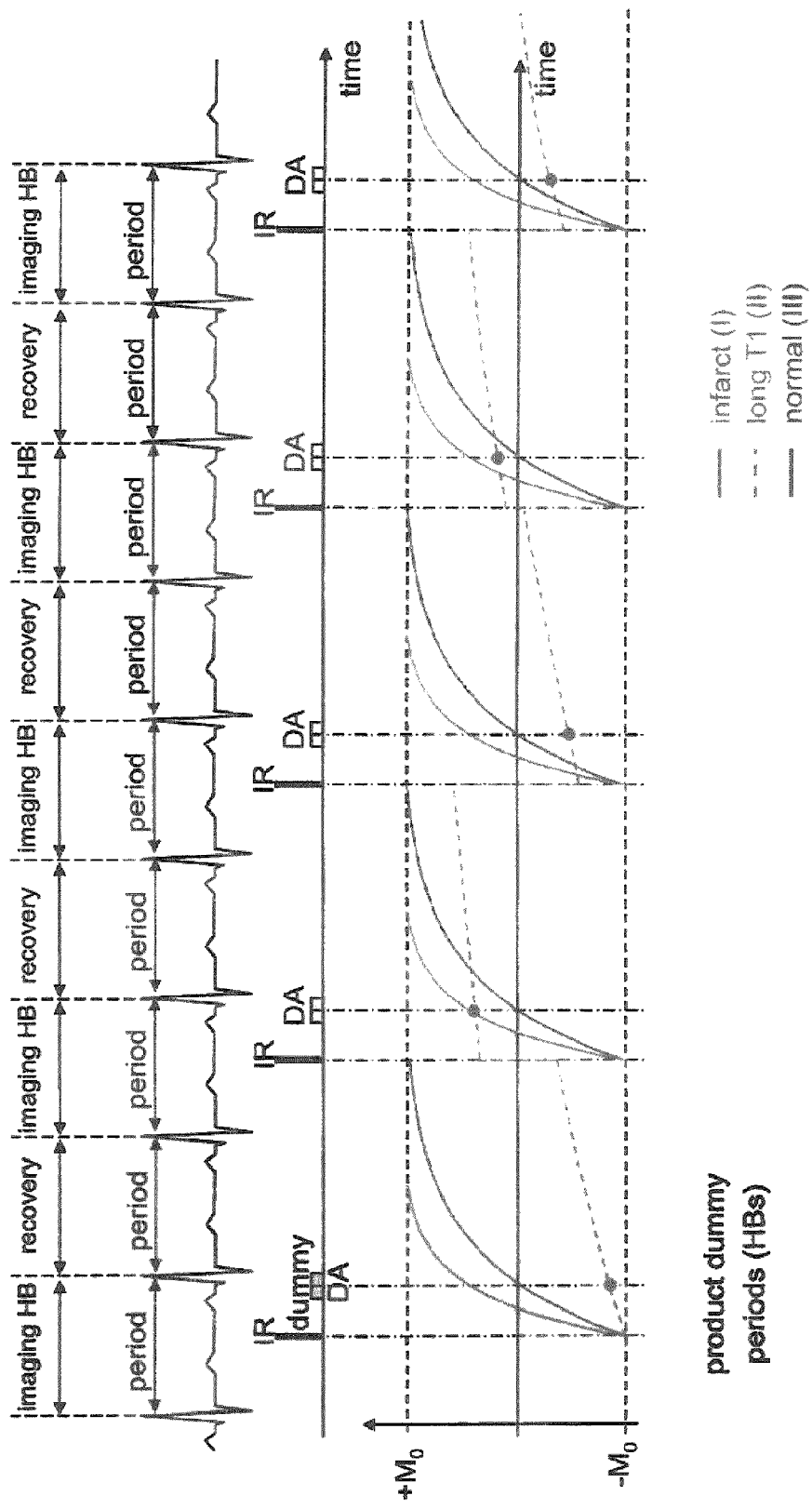
Figure 3A: sequence diagram of the product (never using suppression SR); the first 2 heart beats (HB) are used to get some T1 species to steady state and avoid concomitant artifacts, but this approach does not work for the long-T1 species; also, two extra heart beats are required, one imaging HB with dummy acquisition and one recovery HB.

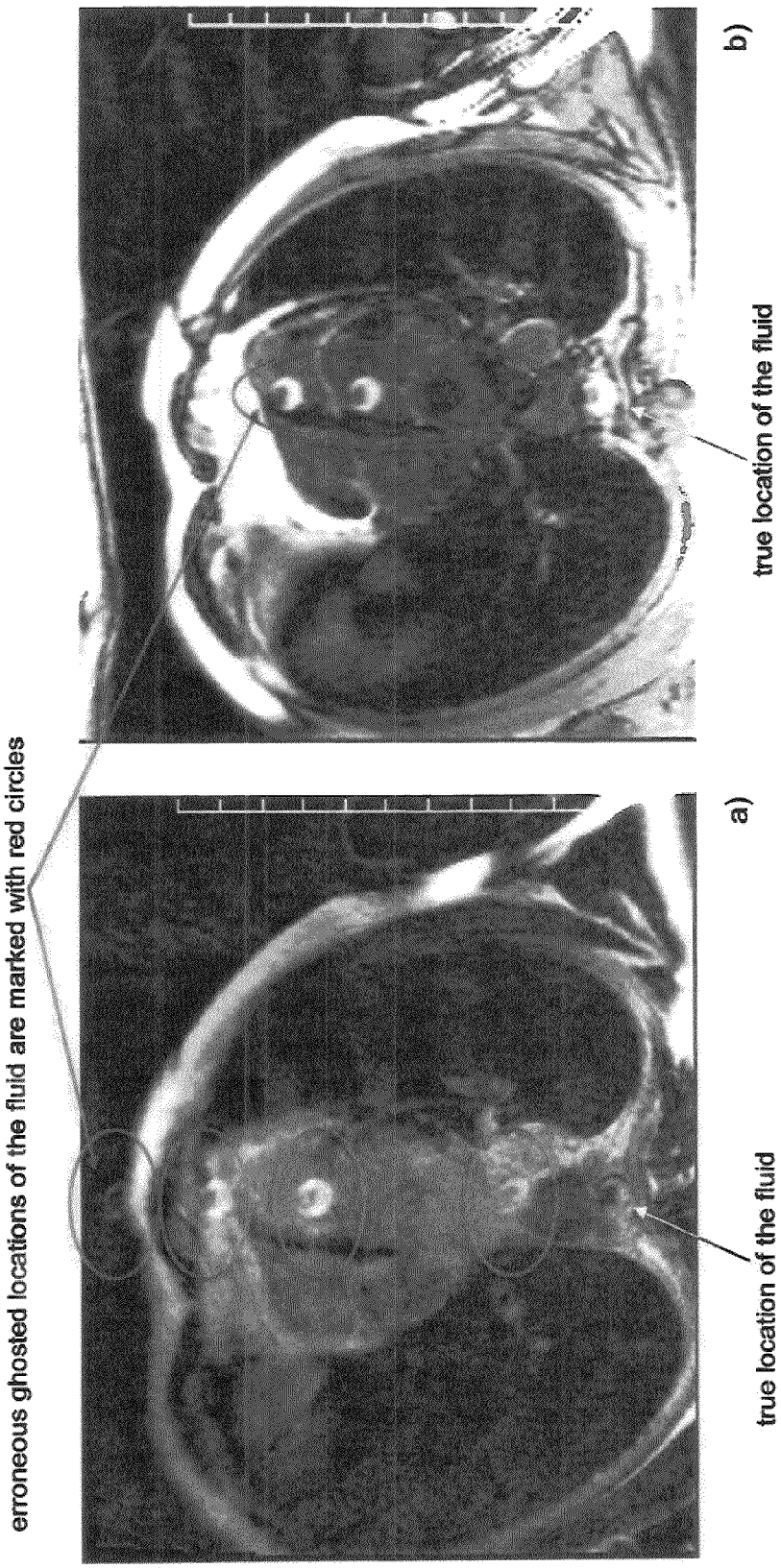
Figure 4: gated segmented inversion recovery TurboFlash (a) and SSFP (b) images in a patient showing multiple ghosting artifacts of fluid in the spinal canal.

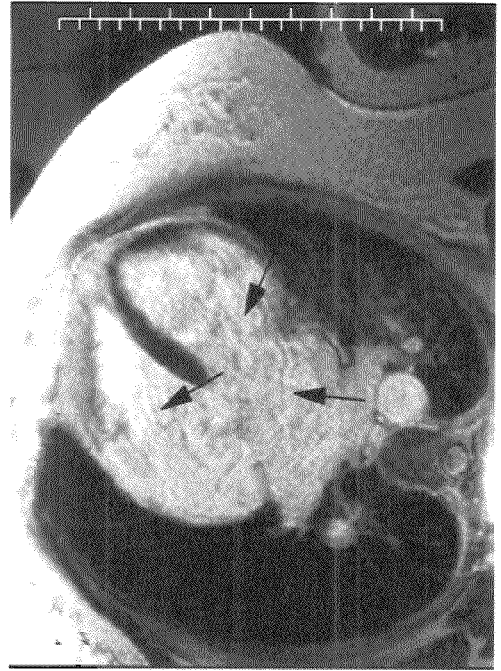
Figure 4B Unclean image as seen by the fine lines in the blood pool, see black arrows.
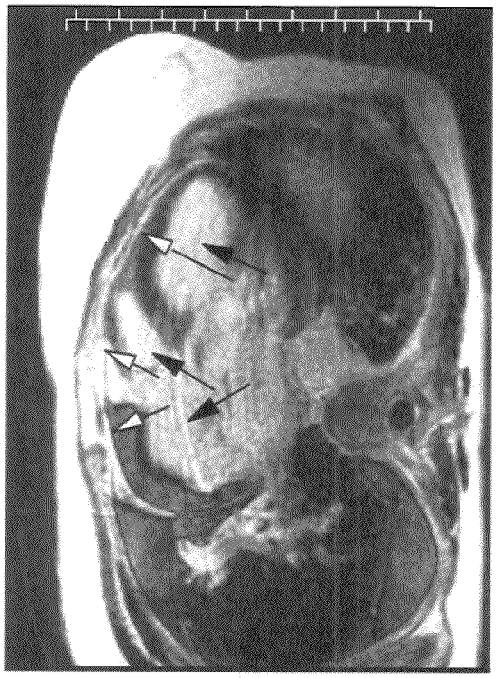
Figure 4A Pericardial effusion (white arrows) and its ghosts (black arrows).
Figure 4A, 4B: Two example images displaying characteristic artifacts caused long T1 species (Prior Art)

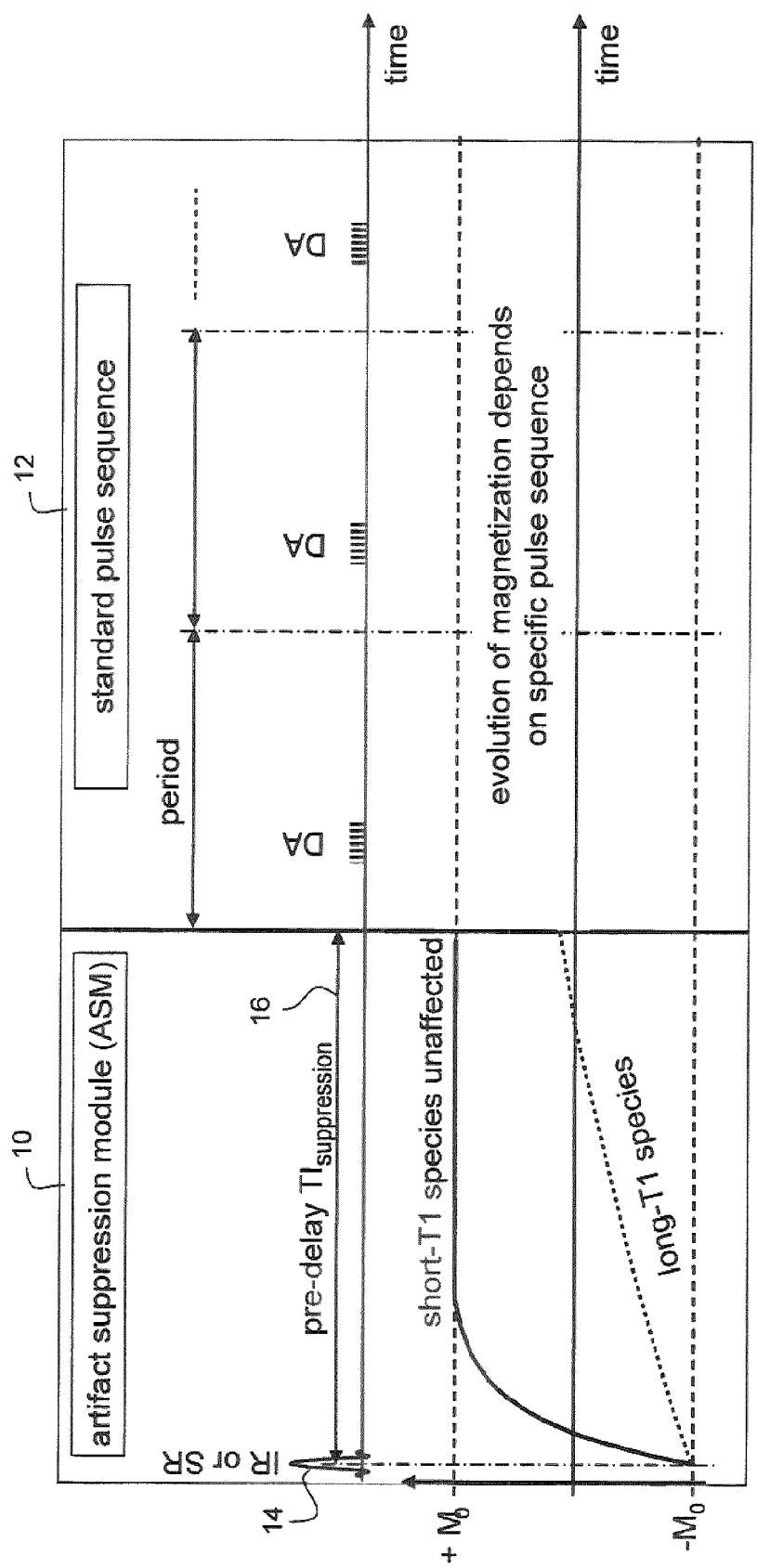
Figure 5A: Artifact suppression module immediately followed by standard pulse sequence

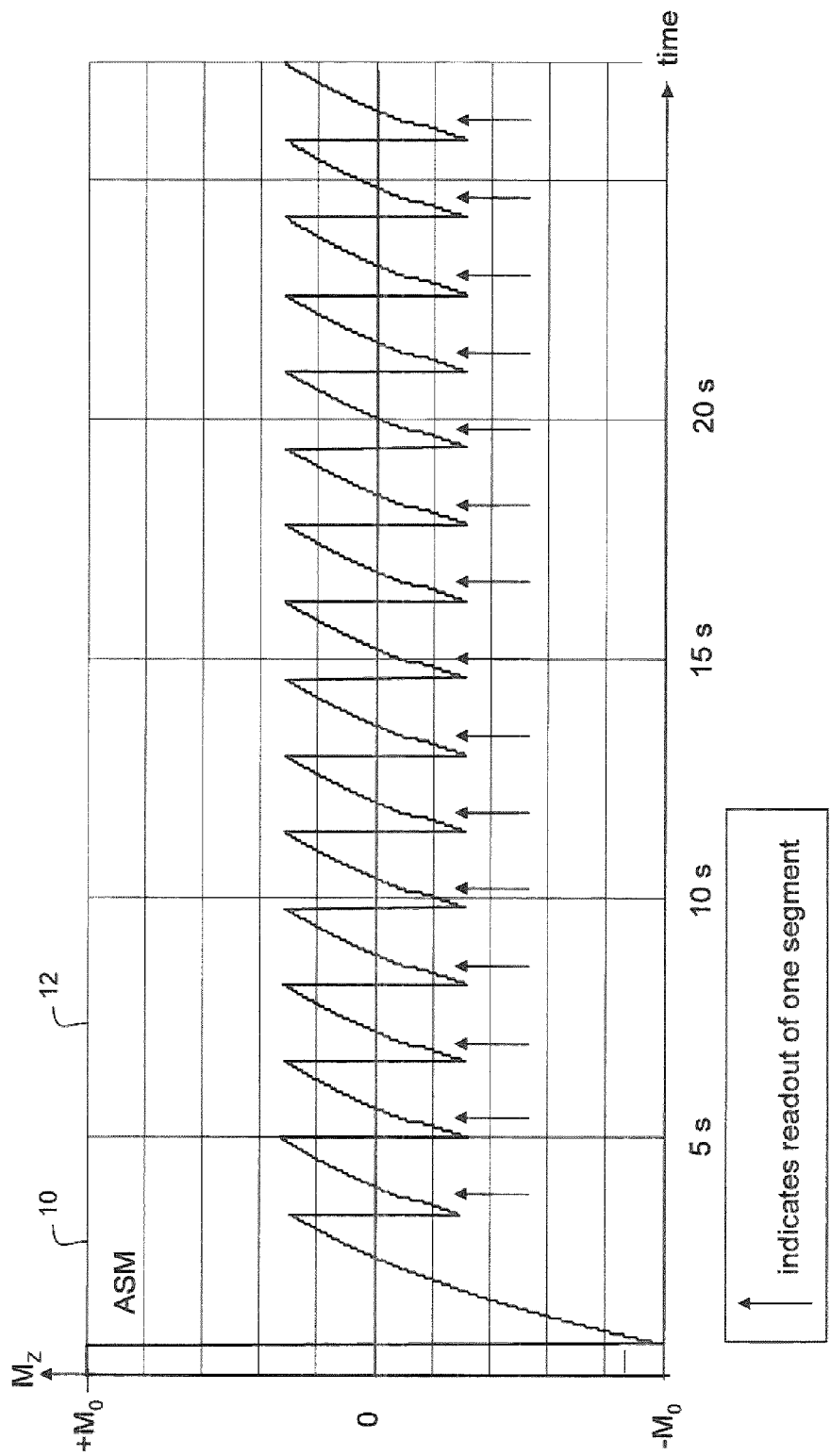
Figure 6: Temporal evolution of the longitudinal magnetization employing artifact suppression module (ASM) and a segmented inversion recovery spoiled gradien echo sequence as example

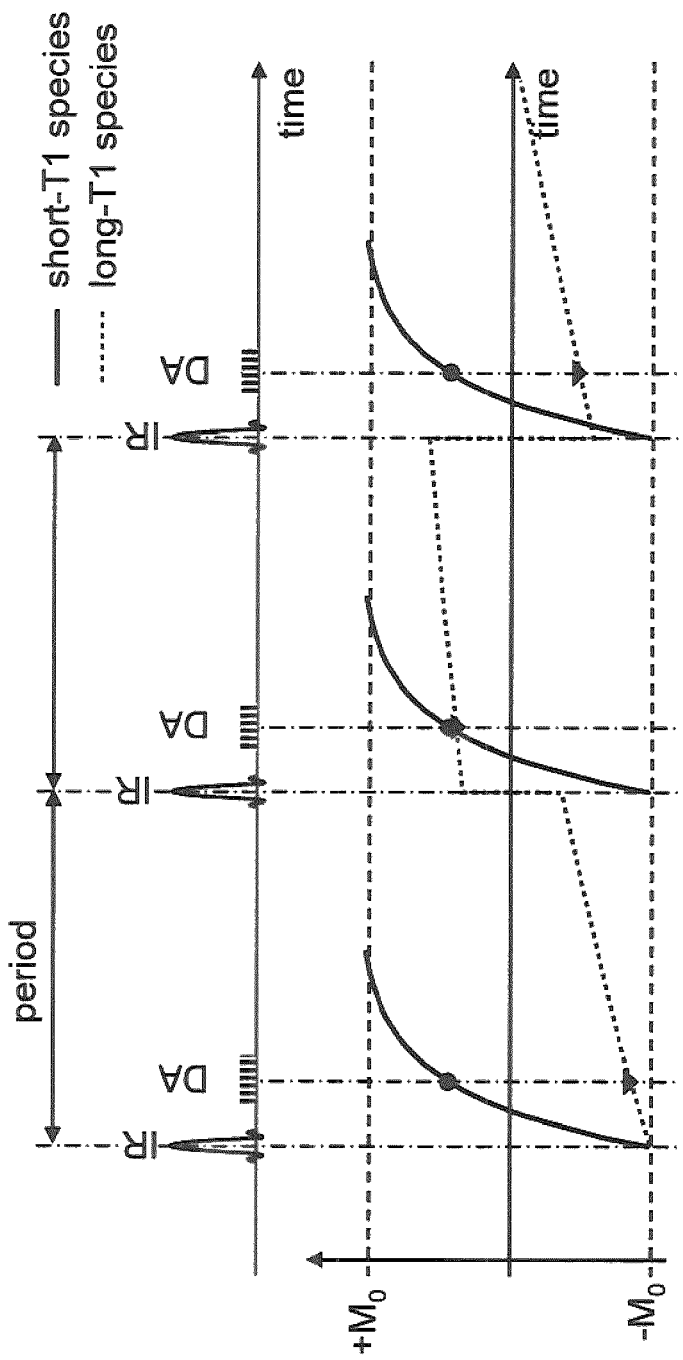
Figure 6A: The long-T1 species magnetization oscillates (triangles at DA), but the short-T1 species does not (dots at DA) (Prior Art)

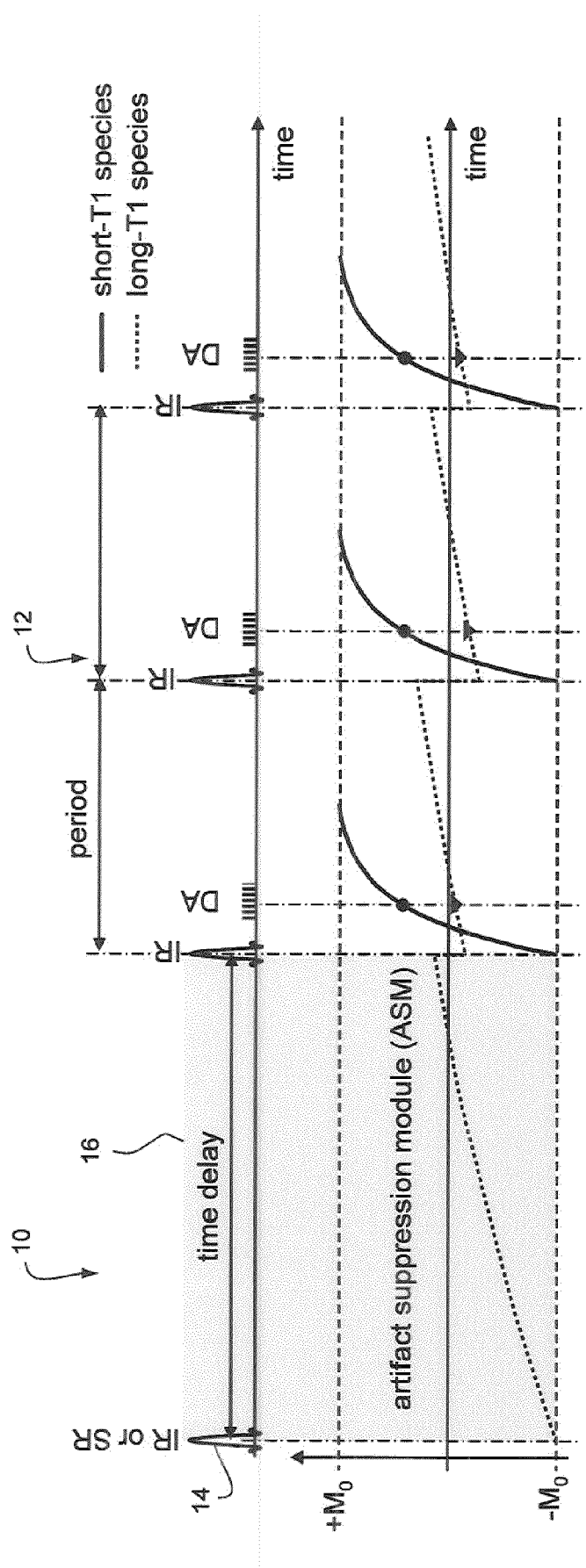
Figure 6B: The artifact suppression module significantly reduces the oscillation amplitude of the long-T1 species magnetization at DA (triangles)

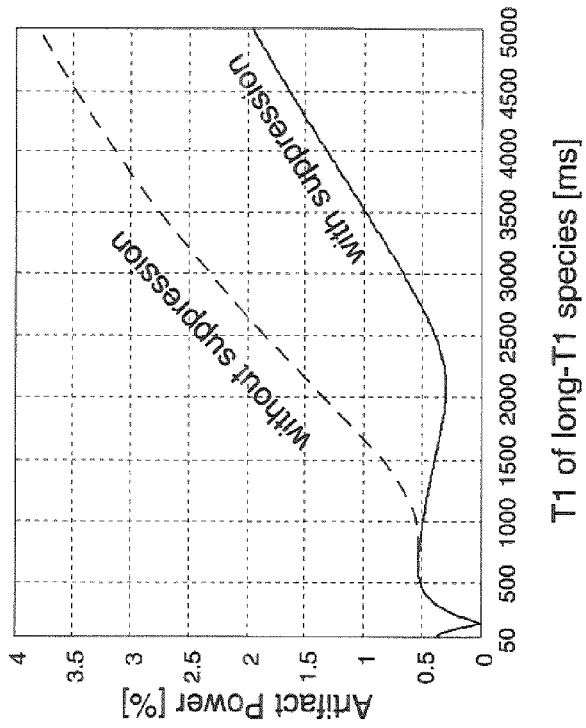
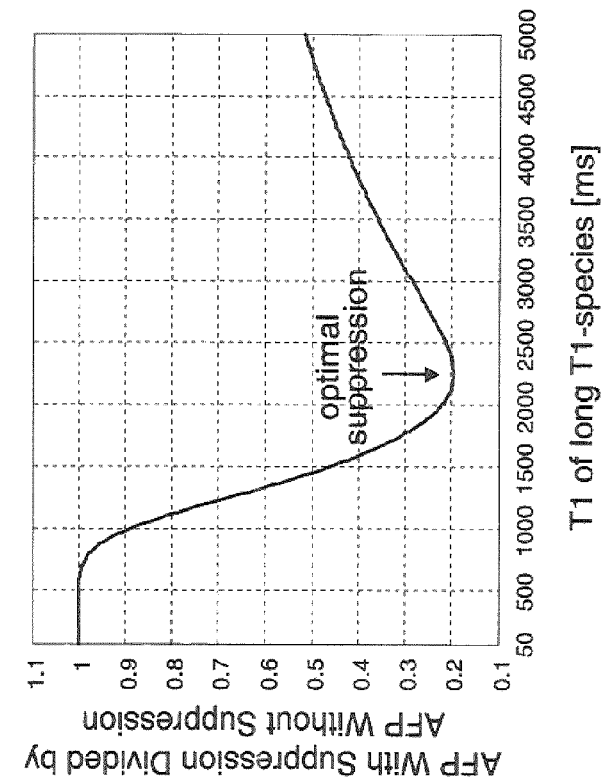
Figure 7A, 7B: Artifact power and response curve of the long-T1 species filter for $TI_{suppression}$ = 2300 ms

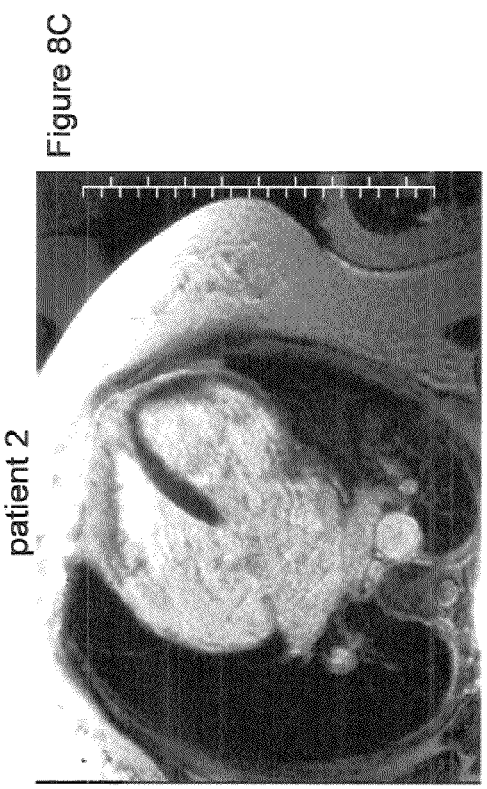
Figure 8A-8D: Delayed enhancement without (top row) and with (bottom row) ASM. The images obtained with ASM have no ghosting artifacts and are cleaner looking

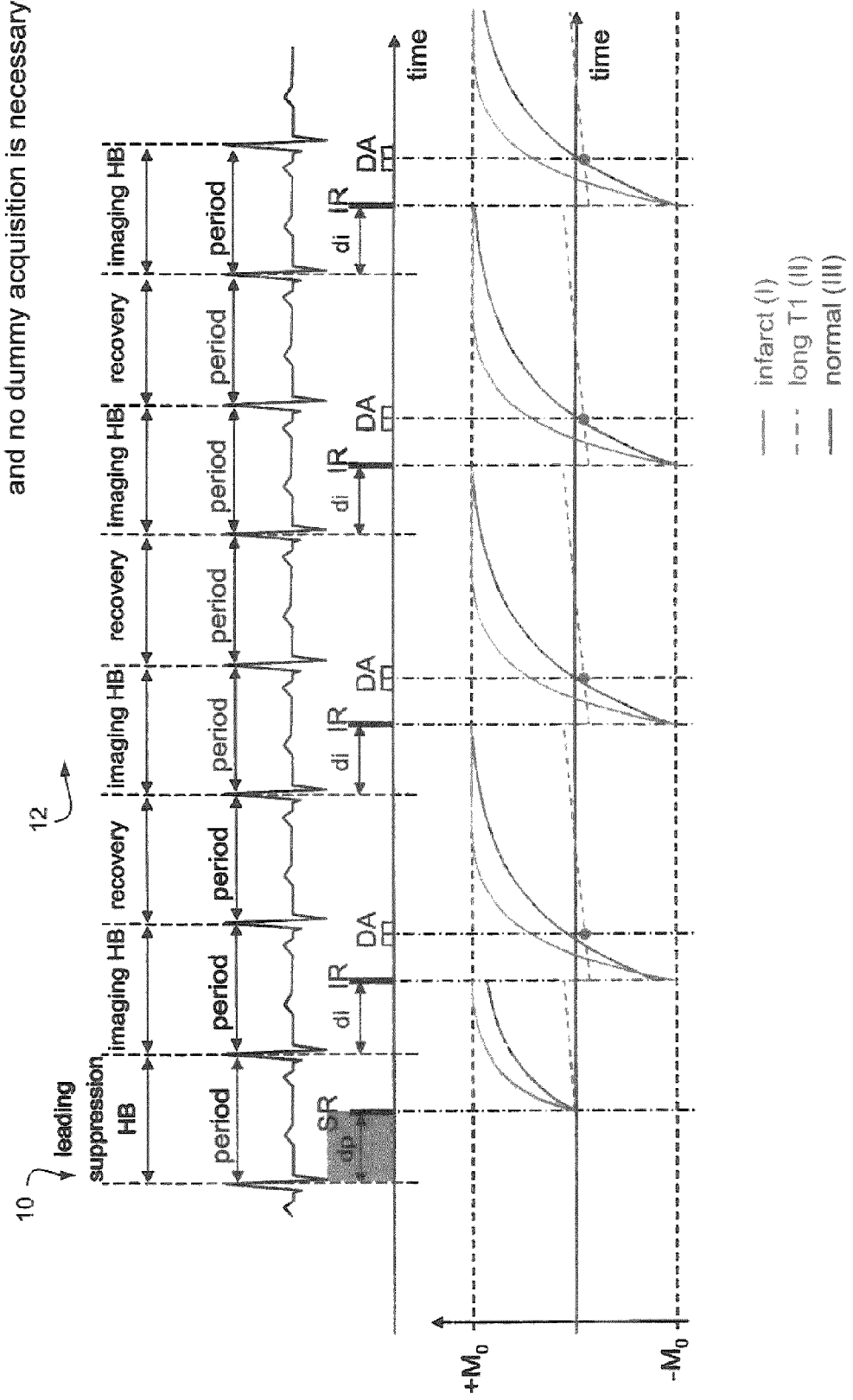
Figure 9: sequence diagram using suppression SR and time delay; only one extra heartbeat is needed and no dummy acquisition is necessary.

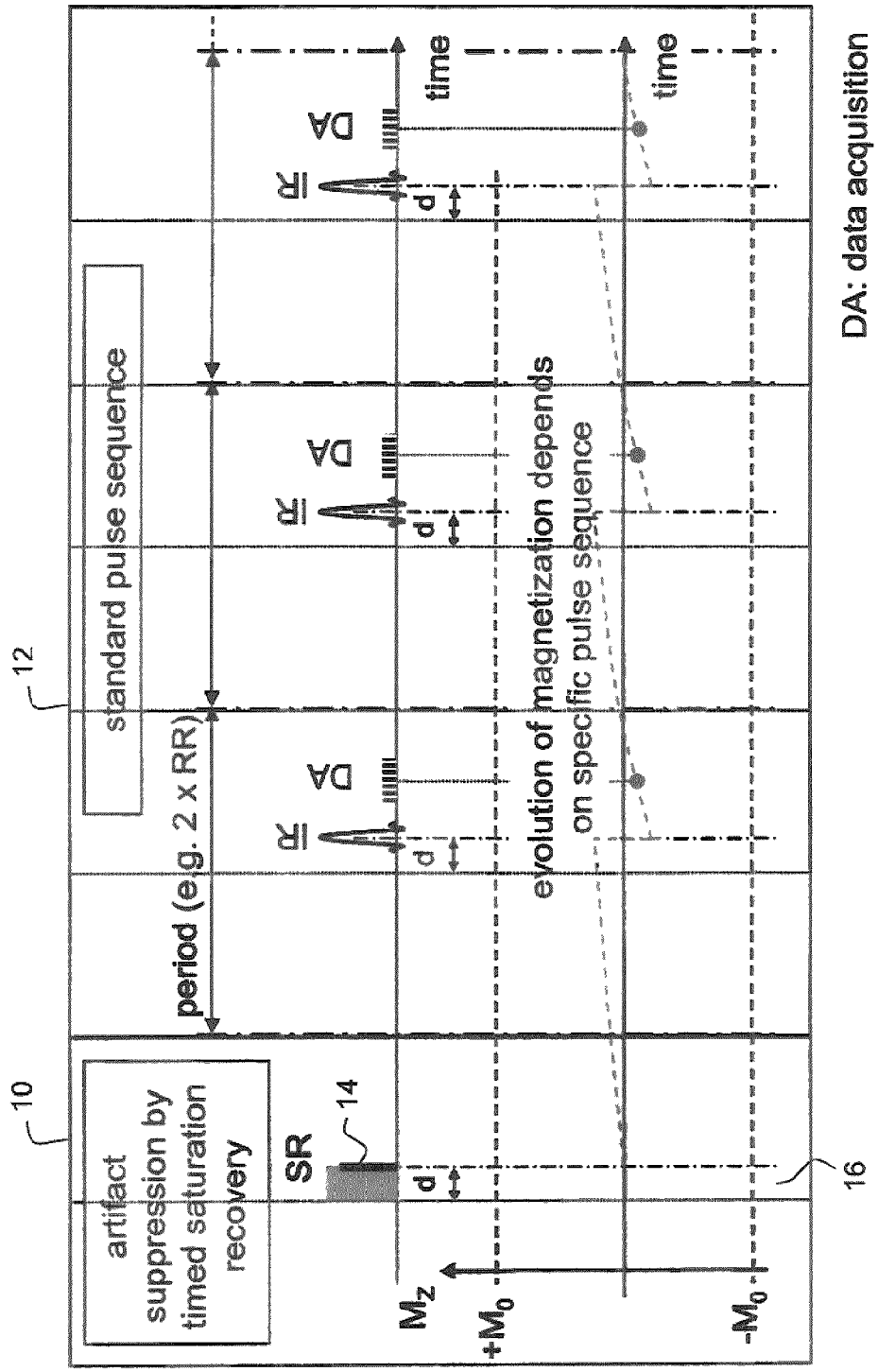

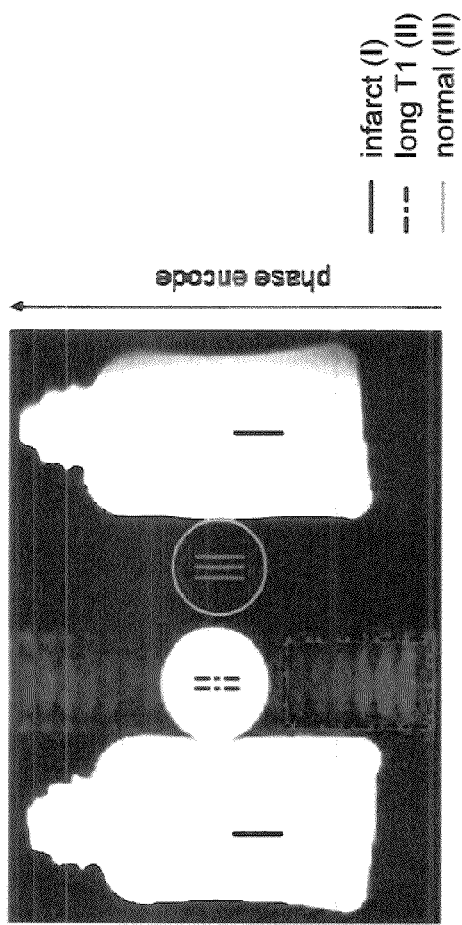
Figure 12A
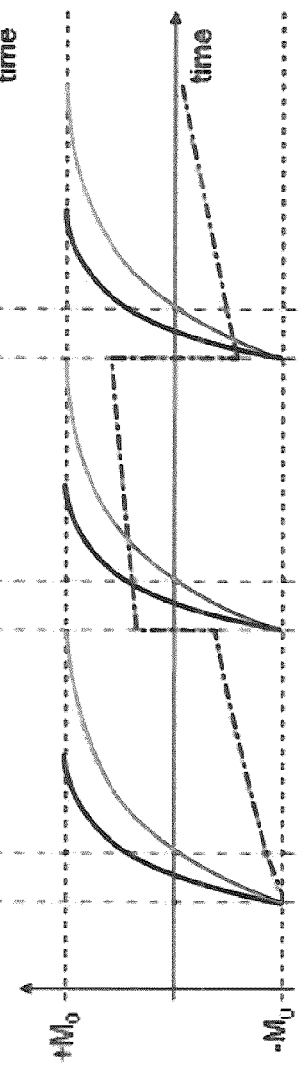
Figure 12B
Figure 12C

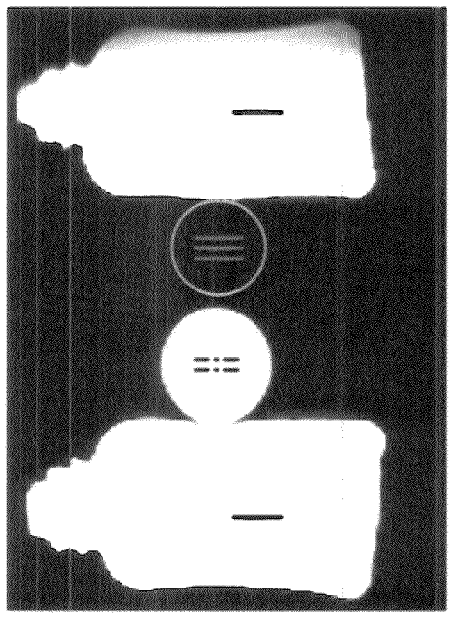
Figure 13A
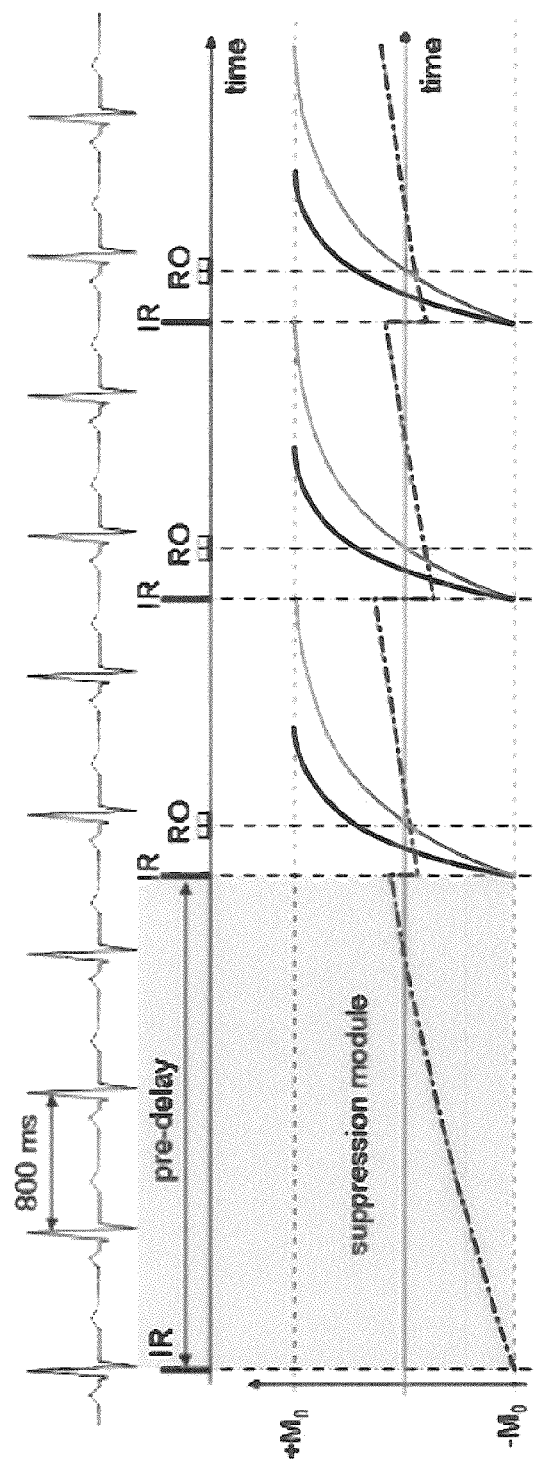
Figure 13B
Figure 13C

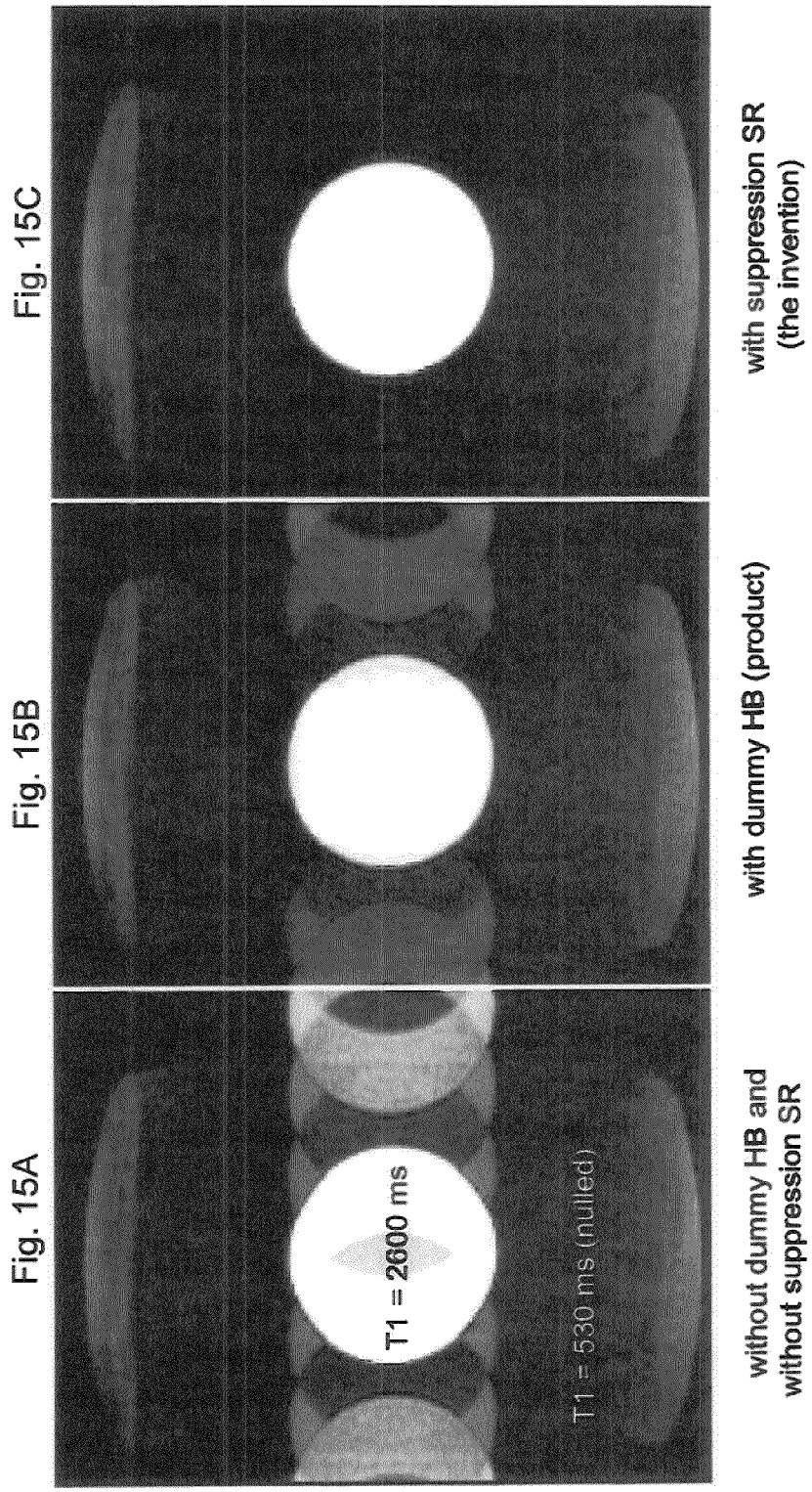
Figure 15: phantom image a) without suppression SR, b) product dummy HB, c) with suppression SR.

Figure 16: patient images a) without suppression SR, b) product dummy HB, c) with suppression SR; upper row shows IR gradient echo (called IR TurboFlash by Siemens) images, lower panel shows IR SSFP (steady state free precession, called TrueFisp by Siemens) images.

Fig. 16A without dummy HB and without suppression SR

Fig. 16B with dummy HB (product)

Fig. 16C with suppression SR (the invention)

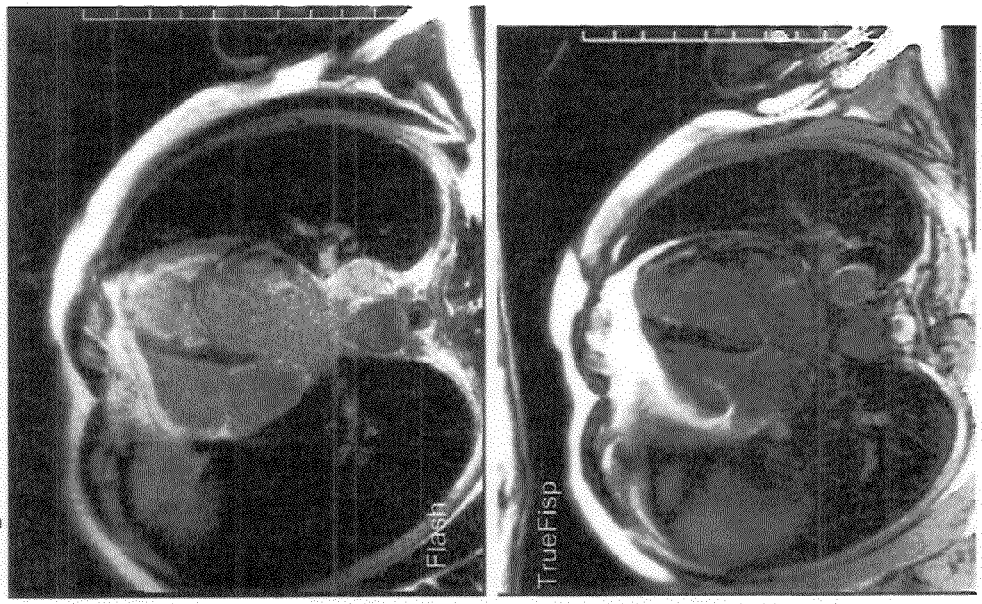
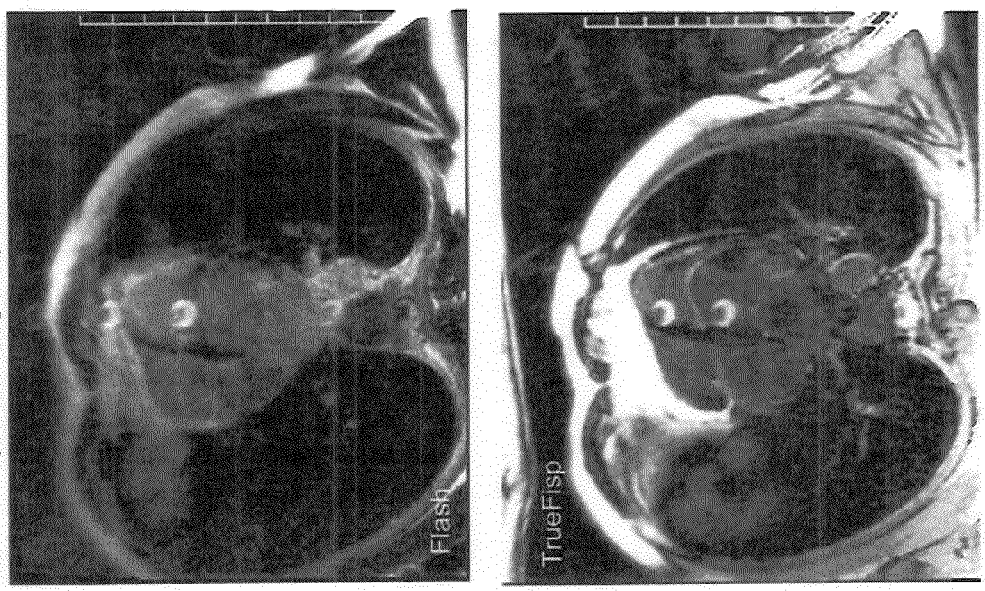

LONG T1 ARTIFACT SUPPRESSION TECHNIQUES FOR MAGNETIC RESONANCE IMAGING

CROSS-REFERENCES TO RELATED APPLICATIONS

This application claims the benefit of priority from U.S. provisional application No. 61/092,881 filed Aug. 29, 2008.

STATEMENT REGARDING FEDERALLY SPONSORED RESEARCH OR DEVELOPMENT

Field

The technology herein relates to suppression of artifacts in Magnetic Resonance Imaging (MRI) and Nuclear Magnetic Resonance (NMR), and more specifically to suppressing artifacts in Magnetic Resonance Imaging (MRI) originating from fluids, tissues and other matter with long T1 values ("long-T1 species") including but not limited to pericardial effusion, pleural effusion, cerebro-spinal fluid, saline breast implants and stomach fluid, when acquiring magnetic resonance data with a pulse sequence that assumes incorrectly that magnetization is at steady state. The technology herein more specifically relates to suppression of signal from long-T1 species by playing a non-selective saturation recovery (SR) or an inversion recovery (IR) prepulse and an associated time delay before the conventional segmented sequence. For example, a "suppression module" comprising a pre-time delay followed by a non-selective saturation recovery (SR) pulse or an inversion pulse followed by a time delay allows maximal recovery of normal myocardium or other tissue, and long T1-species are suppressed while image signal-to-noise ratio (SNR) remains unaffected.

BACKGROUND AND SUMMARY

Myocardial delayed enhancement images acquired with segmented ECG-gated inversion recovery (IR)-prepared sequences often exhibit bright ghosting artifacts which impede the identification of infarcted territory. The artifacts arise from body fluids with long T1 values (e.g. pericardial effusion, cerebrospinal fluid CSF, or pleural effusion). If the amplitude of the oscillating signal could be reduced or if the oscillation could be avoided altogether, the ghost would be virtually eliminated.

In more detail, magnetic resonance imaging (MRI) is a safe, noninvasive test that creates detailed images of organs and tissues. "Noninvasive" means that no surgery is done and no instruments are inserted into the body. MRI uses radio waves and magnets to create images of organs and tissues. Unlike computed tomography scans (also called CT scans) or conventional x rays, MRI imaging doesn't use ionizing radiation or carry any risk of causing cancer.

As one example, cardiac MRI uses a computer to create images of the heart as it is beating, producing both still and moving pictures of the heart and major blood vessels. Doctors use cardiac MRI to get images of the beating heart and to look at the structure and function of the heart. These images can help doctors decide how best to treat patients with heart problems. For example, cardiac MRI is a common test for diagnosing and evaluating a number of diseases and conditions, including:

Coronary artery disease
Damage caused by a heart attack
Heart failure
Heart valve problems
Congenital heart defects
Pericardial disease (a disease that affects the tissues around the heart)
Cardiac tumors
Others.

In MRI, data is generally acquired by a software program called a pulse sequence running on an MRI scanner. Radio frequency and magnetic field "pulses" are used for transmitting energy and for spatial encoding, hence the name "pulse sequence." The loud humming, tapping and buzzing sounds that emanate from the MRI equipment during testing are humanly-perceivable manifestations of the generation of these radio and magnetic field pulse sequences.

The scanner data is generally acquired in a raw format and placed in raw data-space called k-space. The raw data in k-space is then subjected to a mathematical operation called image reconstruction, which yields images showing the examined region of the human body. MRI systems can typically provide many subsets of pulse sequences (data acquisition software) that are tailored to certain parts of the body (e.g., the heart) and the examined pathophysiologies.

Natural motion and flow in the human body such as cardiac contraction and aortic blood flow generally occur too fast to be accurately captured within a single shot. Images with artifacts showing blurred moving structures similar to photos with camera shake would result. Therefore, many MRI techniques divide the data acquisition into repeated acquisition of small data portions of the entire data set, because less data can be acquired in less time resulting in less "camera shake". The acquisition period to acquire a small data portion can be e.g. a heartbeat. These small data portions are called segments and the acquisition is known as segmented acquisition. Such segmented readout sequences are abundantly used throughout the entire body and in particular for cardiac and neuro MRI. For example, in cardiac MRI, in each heartbeat it may be that only 10% of the entire raw data is found. To find the missing data, i.e., the other 90%, the acquisition is repeated in the next nine heartbeats recording a different segment during each of a number of heartbeats until all raw data is found.

To make sure the heart or other organ being imaged is in the same position each time a segment is recorded, the acquisition is typically synchronized or "gated" to a signal obtained from the body. Such gating is a commonly used technique in MRI, and typically involves placing electrodes on the patient's skin. These electrodes pick up the faint electrical signals the patient's nervous system (electrical activity in the heart) generates. The MRI data acquisition can be triggered or gated by these faint electrical signals to synchronize the data acquisition with for example the beating of the heart. Thus for example, in the case of cardiac MRI, the acquisition can be synchronized with cardiac contraction by means of gating to an electrocardiogram (ECG). Gated segmented acquisitions are also used for various regions of the body such as the head, spine, and abdomen.

A schematic representation of an exemplary illustrative non-limiting "gated segmented" pulse sequence is seen in FIG. 1. The "gating" refers to triggering or synchronizing the pulse sequence and associated data capture (for example, to heart beat in response to electrocardiogram signals that stimulate the heart to beat). In the example shown, a first data segment ("segment 1") is acquired ("DA" is "data acquisition") during a particular time period in the first heartbeat R(1) to R(2), the second data segment is acquired during a particular time period in the third heartbeat R(3) to R(4), a third data segment is acquired during a particular time period in the fifth heartbeat R(5) to R(6), and so on.

Rather than gating to an ECG or another physiologic signal, one can also acquire the next segment after a fixed time delay and repeat this until all segments are acquired. The segments are thus recorded in a periodic pattern in a way that does not require gating. To image non-moving organs, segmented techniques can be employed as well. Instead of gating to a physiologic signal (e.g. a patient's ECG), fixed imaging periods are used. The resulting artifacts due to long T1-species are the same.

As discussed above and shown in FIG. 1, the segmenting in the cardiac MRI context refers to acquiring only part of the data during any given heartbeat, and repeating the data acquisition over multiple heartbeats (e.g., with data being captured every heart beat, every other heartbeat, or the like). Since the patient is generally asked to hold her breath during the segmented data acquisition, there is a practical limit to the number of heartbeats in the data collection. Generally speaking, fewer heartbeats are better because this reduces the length of time the patient needs to hold her breath.

One example of such an artifact creating sequence is the inversion recovery spoiled gradient echo sequence also known as IR Turbo FLASH (Fast Low Angle Shot) sequence with magnitude reconstruction. This pulse sequence (shown in FIG. 2) provides a non-selective inversion (IR) pulse before each data acquisition. In the cardiac MRI context, the IR TurboFLASH sequence uses an individual adaptation of the inversion time (TI) between the inversion pulse and data acquisition to achieve optimal signal increase between infarcted and viable myocardium. When a contrast agent is used, the infarcted tissue recovers from the inversion pulse at a different rate as compared to healthy tissue recovery. At the optimal TI, the signal intensity of normal myocardium is nulled. Several breath holds can be necessary to determine the optimal TI value as the acquisition of each image requires a breath hold.

The IR Turbo FLASH sequence has been highly successful in a variety of imaging contexts including cardiac imaging. While this and other segmented sequences are now widely used, there can be some problems in certain applications such as cardiac and other imaging, as will now be explained. In particular, image artifacts in MRI or signal artifacts in spectroscopy or NMR can be caused by such a gated and/or periodic segmented data acquisition when long-T1 species are implicated.

FIG. 3 shows the temporal evolution of an exemplary illustrative non-limiting longitudinal magnetization created by the IR Turbo FLASH sequence. In the example shown, the longitudinal magnetization does not follow the same recovery curve during each of the first five readouts (see arrows in the grey overlay region during the first 7.5 seconds of the sequence). The magnetization has a different polarity at each of the five data acquisition windows. In other words, the acquired magnetization of the long-T1 species is not at steady state, unlike that of the infarcted, and normal myocardium.

Not being at steady state can occur in different sequences and with as well as without magnetization preparation. For example, a so-called "steady-state-free-precession" sequence (SSFP) is actually not at steady state immediately after its start, unless an initial series of dummy pulses is played to drive it to steady state. Even then, matter with very long T1 may not be at steady state. The longer the longitudinal recovery time constant T1 is, the longer it takes the longitudinal magnetization to reach the steady state. These variations in magnetization during segment readout are not without consequences. Imaged matter (fluids, tissue, etc.) with long T1 values including pericardial effusion, pleural effusion, CSF around the brain and spine, stomach fluid, and saline in breast implants, are all prone to this effect.

The magnetization variations shown in FIG. 3 can produce extraneous image elements known as "image artifacts" or "ghost images" that may obscure the true image. Such artifacts have been described for example in a 2005 journal publication Kellman P, Dyke C K, Aletras A H, McVeigh E R, Arai A E, "Artifact Suppression in Delayed Hyperenhancement Imaging of Myocardial Infarction using BI-weighted Phased Array Combined Phase Sensitive Inversion Recovery," Magn. Reson. Med. 2004 February; 51(2): 408-412 and elsewhere, and are commonly seen by radiologists.

One type of artifact stems from species (fluids, tissues) in the body with a long longitudinal recovery time (T1). For example, imaged species with a long T1 include fluids such as pericardial and pleural effusion, cerebro-spinal fluid (brain and spinal canal), and saline in breast implants. Effusions can also occur in other parts of the human body and would cause the same kind of artifact. The artifacts appear if long-T1 species are present in the imaged region and if the images are obtained with an inversion recovery pulse sequence using a so called segmented acquisition as described above that records the different parts of the raw data space (the segments) in a periodic fashion by repeatedly playing out the same scheme of inversion pulse and readout events, but acquiring a different set of lines during every readout. The artifact is referred to as ghosting and is due to the long-T1 species not being at steady state. The structure that contains the long-T1 species is superimposed as "ghosts" at multiple and erroneous locations throughout the image thereby obscuring the patient's morphology.

Image artifacts due to not being at steady state can occur in other sequences as well. For example, a so-called "steady-state-free precession" sequence (SSFP) is not actually at steady state immediately after its start, unless an initial series of dummy pulses is played to drive it to steady state. Even then, matter with very long T1 may not be at steady state. See FIG. 3. The longer the longitudinal recovery time constant T1 is, the longer it takes the longitudinal magnetization to reach steady state. Therefore, fluids with long T1 values called long-T1 species, including pericardial effusion, pleural effusion, CSF around the brain and spine, saline in breast implants, and stomach fluid, are prone to cause such artifacts even when dummy pulses are played.

As FIG. 3A further illustrates, the reason for the creation of long-T1 species ghosts is that these species are in a transient longitudinal magnetization state either during the beginning or throughout the entire duration of the scan. The magnetization transition can be oscillatory (as seen in FIG. 3A), decaying, increasing, or of any other nature. To the image reconstruction these transitions look like sinusoidal waves that modulate the original signal and create additional long-T1 species regions at erroneous 'ghost' locations that are related to the frequencies of the contained sinusoidal waves.

FIG. 4 shows two example images acquired by two exemplary pulses sequences; by a gated segmented inversion recovery (IR) (a) gradient echo and (b) steady state free precession (SSFP) sequence. The patient images contain multiple ghosting artifacts (circled) of fluid in the spinal canal. The artifacts occur if the longitudinal magnetization during data readout varies from one data acquisition (DA) to the next. The magnetization is in a transient rather than a steady state. "Steady" does not mean that the magnetization value is constant over time. Rather it means that the magnetization cycles through the same recovery curve during each imaging period and thus has the same value during each of the periodic data acquisitions.

FIGS. 4A, 4B show two additional example cardiac MRI images with artifacts which have been highlighted with black arrows. Once again, the artifacts can occur if the longitudinal magnetization during data readout varies from one readout to the next. It is in a transient state rather than a steady state during readout. The artifacts are known as ghosts or ghosting artifacts because the region containing the long-T1 species is visible as faint reproduction at various erroneous locations (see FIG. 4A. black arrows) throughout the image in addition to the original correct location (see FIG. 4A, white arrows). Single discrete ghosts as well as multiple ghosts can arise, see FIG. 4A. In some cases, there is no distinct ghost but signal from the long-T1 species is "smeared" across the field of view leading to an overall "unclean" impression of the image as visible in FIG. 4B.

Such ghosting image artifacts can hamper clinical image evaluation and sometimes prevent a clinical diagnosis based on the acquired MR images. For example, a ghost from pleural effusion may be placed on top of the structure of interest such as a long axis view of the heart so that a diagnosis is not possible. Even worse, they can also lead to a wrong diagnosis in for example delayed enhancement (myocardial viability) images. Smaller bright ghosts from the spinal fluid superimposed onto the myocardium may be misinterpreted as infarcts. This would lead to a false positive diagnosis and possibly inappropriate patient treatment.

Past approaches to eliminate such ghosting artifacts include use of dummy periods and the use of saturation slabs. Some current MRI pulse sequences that use an inversion recovery pulse to create image contrast play a "dummy period" at the beginning of the scan. That means, the inversion pulse and the RF and gradient pulses usually played to acquire data are played in this leading period, but no data is recorded (the recoding event is turned off, dummy data acquisition). This approach results in prolonged scan time. Furthermore, this approach generally only weakens the intensity of the ghosting artifact but does not remove it completely. The reason is that a single dummy period is not enough to drive the long-T1 species into steady state. As general rule, the purer a fluid the longer its T1, and the less effective is the product dummy period mechanism. Each dummy period increases the required breath hold time. For example, if the raw data space contains 200 lines, then in a segmented sequence these lines could be acquired in 8 segments of 25 lines each. As these sequence are usually ECG-gated and are executed with a trigger pulse of 2 meaning that each acquisition heart beat (HB) is followed by a recovery HB (to let longitudinal magnetization recover), the scan would take 2×8=16 heart beats during which the patient needs to hold her breath. Playing the dummy period (in this case dummy HB) in the beginning will add an additional two heart beats (one dummy plus one recovery HB). To fully remove the long-T1 ghosting artifact using the product mechanism one would need at least four dummy HBs leading to 4×2=8 additional heart beats. That would require a total of 24 HBs which is beyond a patient's breath hold capability. The situation would be even worse if a trigger pulse of 3 were used, because each additional dummy imaging HB would lead to two additional recovery HBs.

Another known solution is to place a saturation slab or band on top of the long-T1 species, e.g. on top of a pleural effusion or other region containing the long-T1 species. This approach works but is only possible if the long-T1 species is not part of the imaged structure. Therefore, for example, this is not possible for pericardial effusion as the band would destroy the signal of the heart as the organ of interest. Even in contexts (e.g., pleural effusion) where it is possible, this approach generally requires scanner operator skill and time to position the saturation slab and adjust its thickness. Even then, the time point when the saturation pulse is played in the pulse sequence is not optimal and artifacts may still arise. In case there is more than one region with long-T1 species, multiple saturation slabs need to be manually placed, further complicating scanner operation.

Thus, while the prior art proposed certain solutions, further improvements are possible and desirable.

Exemplary illustrative non-limiting technology herein eliminates or substantially eliminates ghosting artifacts in segmented ECG-gated and other IR-prepared sequences caused by the signal oscillations of body fluids and other matter with long T1 values by employing a long-T1 species suppression module One exemplary illustrative non-limiting implementation herein provides a method of suppressing artifacts arising from tissue, fluids, or other long-T1 species when acquiring magnetic resonance data with a segmented pulse sequence that assumes that magnetization is at steady state, said method including suppressing artifacts by producing an artifact suppression module (ASM) before the segmented sequence, the artifact suppression module comprising at least one selective, non-selective, or volume-selective suppression pulse and an associated time delay.

The suppression pulse can for example comprise a non-selective saturation recovery (SR) pulse, an inversion recovery (IR) pulse, a partial inversion recovery pulse, or combination of suppression and inversion pulses with associated specified time delays therebetween The segmented pulse sequence can comprise a segmented inversion recovery sequence. The segmented pulse sequence can use a gradient echo (GRE) readout, a gradient- or RF spoiled gradient echo readout, a steady state free precession (SSFP) readout, or a Turbo-spin echo (TSE) readout.

Data acquisition can comprise acquiring segmented and/or a series of singleshot images and/or a data and a reference data set comprising phase sensitive inversion recovery (PSIR).

Readout may use a Cartesian, radial, elliptical, echo planar 2D readout or a 3D readout.

A further exemplary illustrative non-limiting implementation may provide a method of suppressing artifacts arising from tissue, fluids, or other matter with long T1 value when acquiring magnetic resonance data with a pulse sequence that assumes incorrectly that magnetization is at steady state comprising: applying at least one artifact suppression pulse; waiting a delay time before or after said artifact suppression pulse to permit long T1 matter to achieve steady state magnetization to a segmented pulse sequence to follow; and then applying said segmented pulse sequence to obtain substantially steady state magnetization at readout time.

The at least one artifact suppression pulse may comprise a selective, non-selective, or volume-selective inversion recovery pulse, and said suppression pulse in combination with said time delay together comprise an artifact suppression module (ASM) that is played immediately before the segmented periodic sequence.

The at least one artifact suppression pulse may comprise a non-selective saturation recovery (SR) pulse; a selective, non-selective, or volume-selective partial inversion recovery pulse, and said inversion pulse in combination with a time delay together comprise an artifact suppression module (ASM) that is played immediately before the segmented periodic sequence; or a segmented inversion recovery sequence.

The method may further include acquiring a series of single-shot images; acquiring a data and a reference data set such as but not limited to phase sensitive inversion recovery (PSIR); and/or using a gradient echo (GRE) readout, a gradient- or RF-spoiled gradient echo readout; a steady state free precession (SSFP) readout; and/or a Turbo-spin echo (TSE) readout.

An exemplary illustrative non-limiting magnetic resonance system for imaging tissue, fluids, or long T1 matter while suppressing artifacts arising from non-steady state magnetization of said long-T1 matter during data acquisition may comprise a magnet that exposes said tissue, fluids, or other matter to a magnetic field; a radio frequency transceiver that transmits radio frequency pulses into said tissue, fluids, or other matter and receives corresponding nuclear magnetic responses from said tissue, fluids, or other matter; and a pulse sequence that controls said radio frequency transmitter to (a) apply a pre-pulse and (b) a waited a delay time before beginning a segmented pulse sequence to permit long T1 matter to achieve steady state magnetization to a segmented pulse sequence to follow; before (c) applying said segmented pulse sequence to acquire an image at substantially steady state magnetization of said long-T1 matter.

The pre-pulse may comprises an inversion recovery pulse; a partial inversion recovery pulse; a non-selective saturation recovery (SR) pulse.

A further exemplary illustrative non-limiting NMR imaging method may comprise applying a pre-pulse pulse to a subject to be imaged; waiting a delay time before or after the pre-pulse that is timed to match steady state magnetization of a portion of the subject to a segmented pulse sequence to follow; then applying said segmented pulse sequence to achieve substantially steady state magnetization at readout time; then performing an NMR readout operation; and generating an image of said subject based on said readout operation.

An example non-limiting method of suppressing artifacts arising from tissue, fluids, or other matter with long T1 value when acquiring magnetic resonance data with a pulse sequence that assumes incorrectly that magnetization is at steady state, comprises: applying a suppression pulse; waiting a delay time to permit long T1 matter to achieve steady state magnetization to a segmented pulse sequence to follow; and then applying said segmented pulse sequence to obtain substantially steady state magnetization at readout time.

Other exemplary illustrative non-limiting implementations drive the long-T1 species to steady state within one extra leading imaging period, e.g. one leading extra heart beat. Artifacts are completely removed. This is achieved by a timed saturation recovery played in the extra leading imaging period at, slightly before, or slightly after the time (relative to the beginning of the imaging period) where the inversion is played during the following imaging periods. The improvement in image quality achieved is substantial, yet the implementation is straightforward.

In some exemplary illustrative non-limiting implementations, the time delay dp is selected to be equal to di, where di is the time delay between the beginning of each acquisition period and the inversion recovery (IR) pulse. Delay dp can be also be chosen to be shorter than di, but generally should be larger positive. The exact value of di is a function of the pulse sequence parameters and the imaging period (e.g. the patient's RR interval). A precise calculation of dp can be done to optimize artifact suppression performance but is not necessary due to the robustness of the technique.

Thus, to suppress signal from long-T1 species, a non-selective saturation recovery (SR) or IR prepulse can be played. An IR or SR pulse and a time delay as a "suppression module" allows maximal recovery of normal myocardium. Long T1-species are suppressed while image SNR remains unaffected. One aspect removes ghosting artifacts in magnetic resonance images that stem from species (fluids, tissue or other matter) with long longitudinal relaxation time T1 (as found e.g. in effusions) by immediately driving the long-T1 species to steady state within one extra leading imaging period. This is achieved by playing a saturation recovery radio frequency (RF) pulse in the extra leading imaging period at or slightly before or after the time where the inversion is played during the following imaging periods. These times are relative to the beginning of each imaging period which can for example be the R-wave of the patient's electrocardiogram (ECG).

The exemplary illustrative non-limiting implementation is extremely useful and very versatile. The artifact suppression module can be played out at the beginning of many types of MRI and NMR pulse sequences. It suppresses artifacts in various regions of the human body and in any pulse sequence that acquires data in a segmented and periodic (including but not limited to gated) fashion. There is no disadvantage to the patient other than the slightly increased scan duration due to the duration of the module. Even this is not a true disadvantage as a breath hold is not required while the module is playing.

Interestingly, the exemplary illustrative non-limiting implementation often cleans up MR images even in cases where no distinct ghosting artifacts were visible without the exemplary illustrative non-limiting implementation or where poor image quality had been attributed to factors other than long-T1 species.

The exemplary illustrative non-limiting technique can work for any region of the human body and in any pulse sequence that acquires data in a segmented and periodic (e.g., including but not limited to ECG-gated) fashion. Exemplary illustrative non-limiting implementations can be used with any sort of equipment regardless of vendor, and can be realized by a small software change alone.

Other exemplary illustrative non-limiting features and advantages include:
  Allows reliable artifact suppression without any user input.
    It uses a non-selective suppression pulse so that artifacts from all regions containing long-T1 species are simultaneously prevented.
  Suppresses the artifact completely and does not just weaken it.
  The increase in breath hold time is negligible and considerably shorter than previous approaches.
  Works for all body regions (cardiac MR, head/neuro MR, orthopedic MR, etc.).
  No reduction of signal occurs, thus there is no signal to noise (SNR) penalty.
  Not limited to any specific type of data readout. SSFP (TrueFisp), gradient echo (Flash, Fast Low Angle SHot), and TSE (turbo-spin echo) readout will all show the same artifact provided that they are preceded by an inversion recovery pulse and that images are acquired in a periodic and segmented scheme.
  Extremely useful and very versatile.
  The artifact suppression module can be played out at the beginning of many types of MRI and NMR pulse sequences. It suppresses artifacts in various regions of the human body and in any pulse sequence that acquires data in a segmented and periodic (such as gated) fashion.
  There is no disadvantage to the patient.
  Often cleans up the MR image even in cases where no distinct ghosting artifacts were visible without the invention or where poor image quality had been attributed to factors other than long-T1 species.

Suppresses artifacts originating from fluids, tissue or other matter with long-T1 values referred to as "long-T1 species" such as pericardial effusion, pleural effusion, cerebro-spinal fluid, saline breast implants, and stomach fluid.

Techniques work for any region of the human body and in any pulse sequence that acquires data in a segmented and periodic (such as ECG-gated) fashion.

Vendor-independent and can be realized by a small software change alone.

BRIEF DESCRIPTION OF THE DRAWINGS

These and other features and advantages will be better and more completely understood by referring to the following detailed description of exemplary non-limiting illustrative embodiments in conjunction with the drawings of which:

FIG. 1 is a example prior art gated segmented MRI pulse sequence;

FIG. 2 shows an example prior art gated segmented MRI pulse sequence using non-specific inversion pulses;

FIG. 3 shows prior art temporal evolution of the longitudinal magnetization during a segmented inversion recovery spoiled gradient echo sequence;

FIG. 3A shows a prior art sequence diagram of a conventional pulse sequence wherein the first two heartbeats are used to get some extra T1 species to steady state and avoid concomitant artifacts;

FIG. 4 shows example image artifacts of spinal canal fluid appearing in TurboFLASH and SSPF images;

FIGS. 4A, 4B are example prior art cardiac MRI images displaying characteristic ghosting and other artifacts caused by long T1 species;

FIG. 5A shows an exemplary illustrative non-limiting artifact suppression module consisting of a pre-pulse pulse and a pre-delay immediately followed by standard pulse sequence;

FIG. 6 shows exemplary illustrative temporal evolution of the longitudinal magnetization employing the artifact suppression module (ASM) and a segmented inversion recovery spoiled gradient echo sequence;

FIG. 6A shows how an exemplary long-T1 species magnetization oscillates (triangles at DA), but the short-T1 species does not (dots at DA);

FIG. 6B shows how the exemplary illustrative non-limiting artifact suppression module significantly reduces the oscillation amplitude of the long-T1 species magnetization at DA (dots);

FIGS. 7A, 7B show artifact power and response curve of an exemplary illustrative non-limiting long-T1 species filter for $TI_{suppression}$=2300 ms;

FIGS. 8A-8D show delayed enhancement images without (8A, 8C) and with (8B, 8D) the exemplary illustrative non-limiting artifact suppression module (ASM);

FIG. 9 shows an example sequence diagram using an alternate approach for an artifact suppression module, namely a non-selective saturation recovery (SR) pulse and associated pre-sequence delay time;

FIG. 10 shows an example illustrative non-limiting implementation provide artifact suppression by timed saturation recovery followed by a conventional standard segmented pulse sequence;

FIG. 12A shows ghosting artifacts arising from phantom II (T1=2600 ms) with no suppression module;

FIGS. 12B-12C are examples of imaging performed with the artifact suppression module OFF (pre-delay 2600 ms);

FIG. 13A shows phantom images obtained with the artifact suppression module ON (the relative artifact SNR for a 2600 ms pre-delay is 21% of the case shown in FIG. 9A);

FIGS. 13B-13C show example non-limiting suppression module pre-delay timing;

FIGS. 15A-15C show example phantom images without suppression, using dummy acquisition intervals (e.g. heart beats) and with suppression, respectively; and FIGS. 16A-16C and 17A-17B show example illustrative non-limiting patient images.

DETAILED DESCRIPTION

The exemplary illustrative non-limiting implementation can suppress artifacts arising from tissue, fluids, or other matter with long T1 values (long-T1 species) when acquiring magnetic resonance data with a pulse sequence that assumes incorrectly that magnetization is at steady state. The exemplary illustrative non-limiting implementation provides an "artifact suppression module" (ASM) (see FIG. 5) that includes an inversion (or partial inversion) recovery (IR) or saturation recovery (SR) pre-pulse and a time delay (pre-delay). Such a pulse can be non-selective, slab-selective, slice-selective, etc. In this context, "selective" means selective with respect to particular structures of the body to be imaged. Thus, a "slice-selective" pulse means a pulse that selects a cross-sectional slice of the body, a "slab-selective" pulse means a pulse that selects a slab, a "volume-selective" pulse means a pulse that selects a volume, and a "non-selective" pulse means a pulse that is not selective. Furthermore, the term "time delay" means waiting or timing a predetermined (not accidental) delay time.

Figure 5:
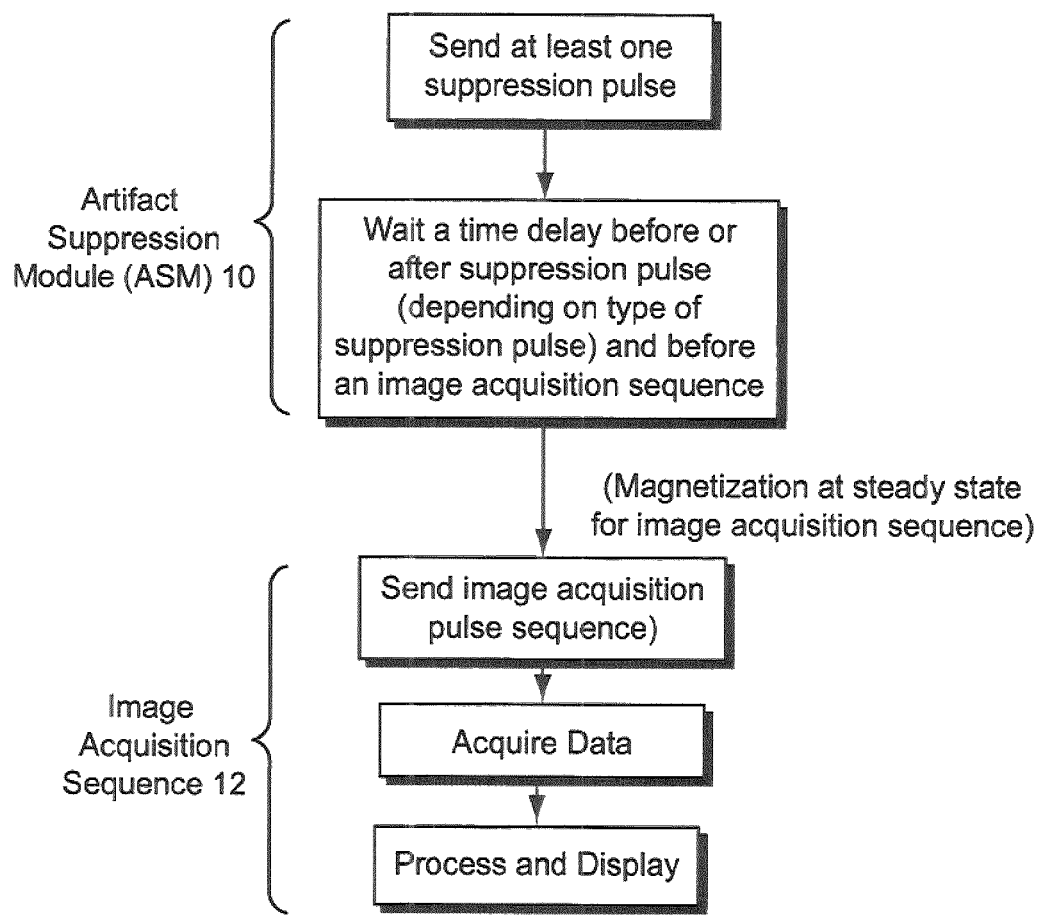
FIG. 5 shows an example flowchart.

FIGS. 5 and 5A show one such example non-limiting illustrative sequence employing an artifact suppression module (10) immediately followed by a standard pulse sequence 12. The standard pulse sequence 12 can be any gated or non-gated segmented or other pulse sequence including as one example the Turbo FLASH sequence described above. The artifact suppression module 10 in the exemplary illustrative non-limiting implementation shown includes an inversion or partial inversion recovery pulse IR or a saturation recovery pulse 14 and an associated pre-delay 16.

In the case of the inversion or partial inversion recovery pulse (IR), the delay 16 follows the pulse and its timing allows the short-T1 series to recover substantially completely before the standard pulse sequence begins so that they are unaffected or substantially unaffected by the inversion pulse. The delay between the inversion pulse and the beginning of the standard pulse sequence 12 is carefully chosen so that long-T1 species (e.g., certain fluids) have recovered only to a predetermined degree when the standard pulse sequence 12 begins. In particular, the delay time is chosen to permit the long-T1 species to recover precisely to a magnetization level matching the steady stage magnetization level achieved by the standard pulse sequence 12. In this way, the artifact suppression module uses one or more IR pulses to "prime" the magnetization of the long-T1 species so that after the pre-delay time has expired, the magnetization matches or substantially matches the steady state magnetization achieved by the standard pulse sequence 12. Different standard pulse sequences 12 may achieve different long-T1 series steady state magnetization levels, so the pre-delay time 16 is set according to the T1 recovery time of the species being imaged and the steady state magnetization achieved by the standard pulse sequence.

In the case of a saturation recovery (SR) pre-pulse 14, the delay 16 may be introduced before the pre-pulse and may be selected to be equal to di, where di is the time delay between the beginning of each acquisition period and the inversion recovery (IR) pulse within the conventional sequence to follow. See FIG. 9. Delay dp can be also be chosen to be shorter than di, but generally should be larger positive. The exact value of di is a function of the pulse sequence parameters and the imaging period (e.g. the patient's RR interval). A precise calculation of dp can be done to optimize artifact suppression performance but is not necessary due to the robustness of the technique.

FIG. 5 thus shows the suppression module 10 that is immediately followed by the standard image acquisition sequence 12. The time delay 16 in one example can be called $TI_{suppression}$ and can be adjusted to suppress signal from a certain long-T1 species. However, one value for $TI_{suppression}$ reliably suppresses the signal from a range of long-T1 values around the optimal T1. In some implementations, the suppression module 10 acts as a long-T1 species filter that selectively prevents signal from certain long-T1 species from causing artifacts.

FIG. 5 shows a time delay before playing the suppression pulse, but time delay before the suppression pulse is actually not necessarily required. Such a time delay is used in the exemplary illustrative non-limiting implementation if the sequence is gated, because then there exists an optimal time point for the suppression pulse in each imaging period, and to get to that time point, a time delay relative to the trigger (e.g. patient's R-wave) is used. But if non-gated, no time delay is required as there is no time reference such as an ECG. In the case of more than one suppression pulse, a time delay between the first and the second, second and third etc. would be used.

The exemplary illustrative artifact suppression module (ASM) 10 allows the long-T1 species to quickly reach steady state. The absence of a transient magnetization state results in the absence of artifacts. This is illustrated in FIG. 6, which shows the temporal evolution of the longitudinal magnetization belonging to the long-T1 species. The ASM 10 drives the magnetization to such a state that the same longitudinal magnetization is traversed every imaging period leading to the same magnetization value at the time of every readout. This is known as being in steady state. As FIG. 6 shows, the ASM 10 causes the long-T1 species to have a magnetization matching the steady state magnetization of the standard pulse sequence 12 before the standard pulse sequence has even begun.

FIGS. 6A and 6B compare the prior art approach with the approach of the exemplary illustrative non-limiting implementations herein. FIG. 6A shows that in the prior art approach, magnetization relaxation level of the short-T1 species is substantially uniform during data acquisition (DA) (see dots in the Figure) whereas the magnetization of the long-T1 species oscillates during data acquisition until steady state is reached (see triangles). Compare FIG. 6B which shows an exemplary illustrative non-limiting artifact suppression module 10 employing an inversion pulse (IR) followed by a time delay 16 (if a saturation pulse is used, the delay should precede the saturation pulse rather than follow it). FIG. 6B illustrates how the artifact suppression module 10 significantly reduces the oscillation amplitude of long-T1 species magnetization at data acquisition (see triangles) without adversely affecting the substantially constant magnetization relaxation level of the short-T1 species at data acquisition.

FIG. 7A shows the artifact power (AFP) created by the standard sequence alone (without suppression, dashed line) and with the suppression module (solid line). FIG. 7B shows the artifact power created by the standard sequence preceded by the ASM (with suppression) relative to the artifact power created by the standard sequence alone (without suppression).

FIG. 7A thus shows long-T1 magnetization at a variety of different levels (see triangles) during readout. Compare FIG. 7B which shows long-T1 magnetization being at substantially the same levels (see triangles once again) during readout after the inversion pulse and time delay provided by the artifact suppression module.

One can define the artifact power (AFP) as the maximum of the standard deviation that was observed outside a completely homogeneous digital phantom in a simulated image. This area should, without the presence of an artifact, be completely homogeneous. To detect the inhomogeneity caused by the artifact, it is possible to choose the standard deviation of the image intensity in that area rather than its mean, because it is more sensitive. It is then possible to take the maximum as the worst artifact in an image is the largest contributor to the overall perceived image quality. Note that AFP does not refer to power as in 'electric power'.

In more detail, FIG. 7B shows the filter response curve for a predelay $TI_{suppression}=2300$ ms. It was obtained by dividing the AFP curve with suppression by the AFP without suppression, both from FIG. 7A. Although only a single $TI_{suppression}$ was employed, artifacts from a wide range of long-T1 species are suppressed. Optimal suppression is achieved at T1=2250 ms, but using for example 0.3 as cutoff value, the response remains below 0.3 in the range of 1800 ms to 3100 ms ensuring proper artifact suppression in a wide T1 range around the optimal T1. Note also that the filter does not affect short T1 species. This is the intended nature of this filter as it is generally not desirable to filter out these short T1 species that do not cause artifacts anyway.

FIGS. 8A-8D show exemplary illustrative non-limiting delayed enhancement images of two cardiac patients without (top row, FIGS. 8A, 8C) and with the exemplary illustrative non-limiting implementation (bottom row, FIGS. 8B, 8D). In the images using the exemplary illustrative non-limiting implementation the artifacts are well suppressed. The images obtained using the exemplary illustrative non-limiting implementation (bottom row) have no ghosting artifacts and are cleaner looking than the standard images in the top row.

Although the exemplary illustrative non-limiting implementation was made in cardiac MRI, long T1 species occur throughout the human body and the idea is hence applicable to MRI of any body region. CSF e.g. is abundant around the brain and spine. If the sequence following the ASM is a segmented sequence, and if the data acquisition occurs repeatedly at periodic time points, it is irrelevant how the acquisition's periodicity is achieved. It can be created by a fixed time period between adjacent acquisitions or by gating to the ECG, to a finger pulse (pulse oxymetry), to the position of the diaphragm (navigator gating), or by any other method. For the artifact to arise and the exemplary illustrative non-limiting implementation to suppress it properly, it is also irrelevant whether the acquisition period varies during the acquisition for example as consequence of ECG gating to a fluctuating heart rate.

As explained above, one predelay $TI_{suppression}$ suppresses the artifacts from a range of long-T1 values, for example from pericardial effusion as well as stomach fluid, despite their slightly different T1 values. This is useful because it means that adjusting the pre-delay as function of the exact T1 value becomes unnecessary, and no user-controllable predelay needs to be provided in the scanner's user interface. Rather, one setting for delay time can work reliably for all long-T1 species.

Saturation Prepulse Embodiment

While some exemplary illustrative non-limiting implementations use inversion or partial inversion pre-pulses followed by a time delay, saturation recovery prepulses or a combination of saturation and inversion pulses could be used. For example, another exemplary illustrative non-limiting implementation provides an artifact suppression module that consists of a saturation recovery (SR) pre-pulse preceded by a time delay dp (pre-delay) relative to the beginning of the period. See FIG. 9. The module is played in the period immediately before the regular imaging pulse sequence. Time delay dp is selected to be equal to di, where di is the time delay between the beginning of each acquisition period and the inversion recovery (IR) pulse. Delay dp can be also be chosen to be shorter than di, but must be larger positive. The exact value of di is a function of the pulse sequence parameters and the imaging period (e.g. the patient's RR interval). A precise calculation of dp can be done to optimize artifact suppression performance but is not necessary due to the robustness of the technique.

FIG. 10 show how an exemplary illustrative artifact suppression module can be incorporated into an existing conventional pulse sequence. The new "suppression module" is played out prior to the existing sequence. This example technology could be included into the code that controls the looping of the scan (e.g. looping over the heart beats and the segments).

To understand how this artifact suppression module works, one can compare the temporal evolution of the magnetization of the long-T1 species in FIGS. 3A and 9 (dashed blue lines). FIG. 3A shows that without the artifact suppression module (and even in the presence of the leading dummy periods used in the product sequence with the intent to suppress these artifacts), the magnetization at the data acquisition points (big blue dots) oscillates widely from one acquisition to the next. FIG. 9 shows that with the artifact suppression module the magnetization is about the same at all data acquisition points. There is hardly any oscillation. The long-T1 magnetization curve has a nearly identical evolution for all imaging periods. This is known as being in steady state and is the condition for ghosting not to occur.

Example

Figure 11:
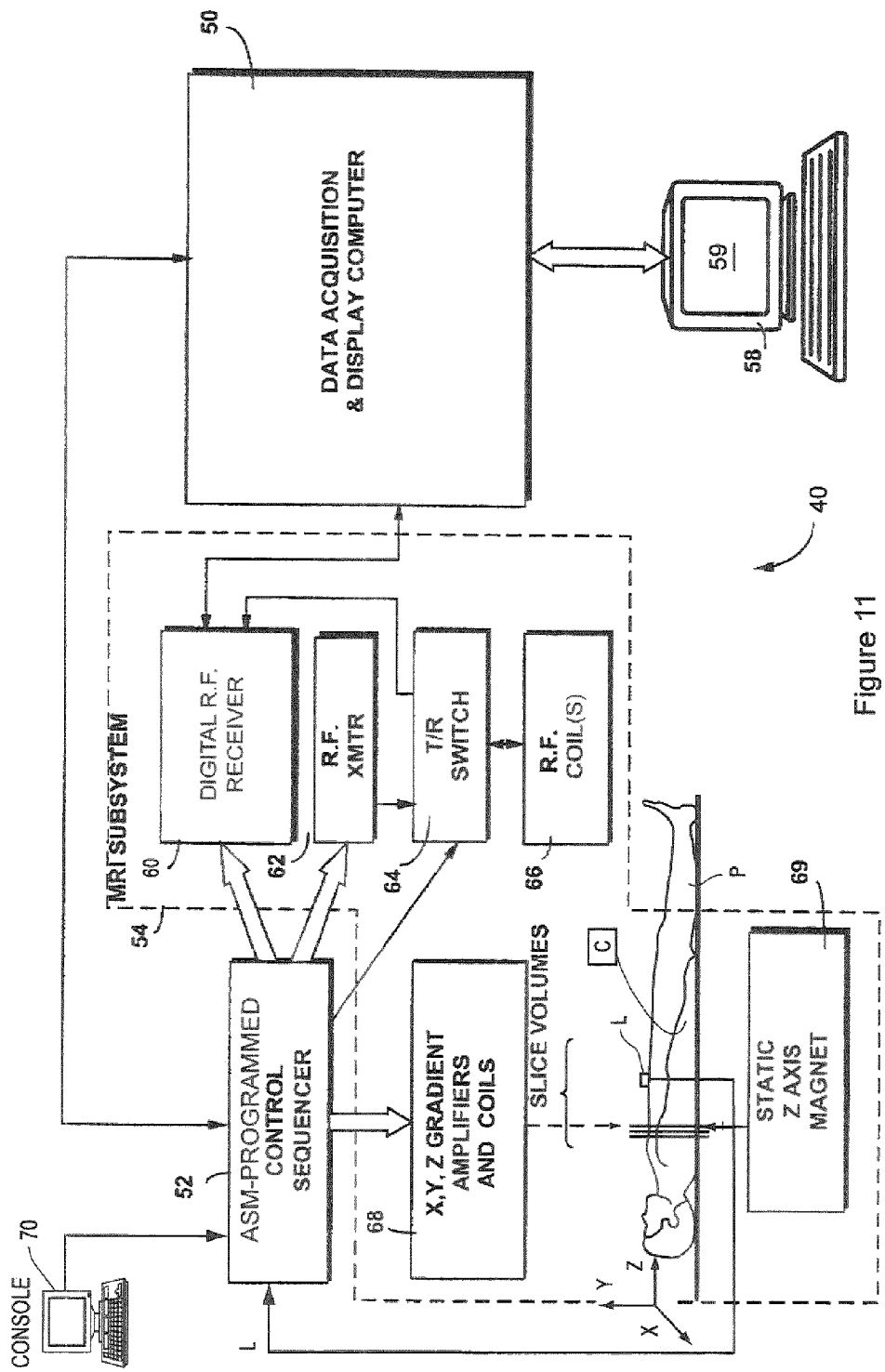
FIG. 11 shows an example magnetic resonance imaging system.

FIG. 11 shows an example non-limiting magnetic resonance imaging system 40 including a conventional magnet 69, RF transceiver 60, 62 and image reconstruction computer 50 which displays an image 59 on display 58. The exemplary illustrative non-limiting implementation has been programmed and successfully used on a Siemens Avanto (e.g., 1.5 Tesla) and a Siemens or Sonata scanner, but it can be implemented on any commercial cardiac or other MRI scanner irrespective of the manufacturer. No additional hardware is required, a software change (see block 52) suffices. The module could be integrated into portions of the software so that it can be played prior to all segmented inversion recovery sequences in the same way that the current dummy heart beats are used. The specified timing is applicable to MRI scanners with a 1.5 Tesla field strength, but it can be slightly modified to accommodate the 3 Tesla field strength scanners that are increasingly gaining in popularity. In fact the exemplary illustrative non-limiting implementations described herein work irrespective of the field strength. FIG. 8 shows an envisioned implementation into existing standard pulse sequences.

In one specific example non-limiting implementation, we added a suppression module 10 in front of the standard segmented ECG-gated IR-TurboFLASH sequence 12, which could be activated from the user interface. The pre-delay 16 defined as time between the suppression IR pulse and the first IR pulse of the standard sequence was also controllable (even though it is not necessary that the pre-delay is user-controllable, see above). On a 1.5T clinical MRI scanner (e.g., MAGNETOM Avanto, Siemens Medical Solutions, Erlangen, Germany) we imaged three phantoms (I, II, and III) shown in FIGS. 9a and 10a with different T1 values (I: T1 290 ms 'infarct', II: T1 2600 ms 'long-T1 species', III: T1 490 ms 'normal myocardium'). Sequence parameters included: T1 340 ms to null normal myocardium, RR 800 ms, trigger pulse 2, flip angle 15°, lines/segment 7, TE 3.85 ms, echo spacing 9 ms, bandwidth 130 Hz/pixel. Imaging was performed with the suppression off (FIG. 9a) and on (FIG. 10a, pre-delay 2600 ms).

Magnetic resonance imaging (MRI) machines such as the one shown are usually located at a hospital or at a special medical imaging facility. A radiologist or other physician with special training in medical imaging oversees MRI testing. Cardiac MRI usually takes 45 to 90 minutes, depending on how many images are needed. Cardiac MRI is painless and harmless. The patient lies on her back on a sliding table that goes inside a tunnel-like machine. The MRI machine makes loud humming, tapping, and buzzing noises. Remaining very still during the test is important. Any movement may blur the images. The patient may be asked to hold her breath for 10 to 15 seconds at a time while the technician takes pictures of her heart. Researchers have been studying ways that will allow someone having a cardiac MRI to breathe freely during the exam, while achieving the same image quality. But currently, holding one's breath during data acquisition is usually necessary.

FIG. 12A shows ghosting artifacts arising from phantom II (T1=2600 ms). This ghosting in the phase encoding direction results from sign oscillations and amplitude changes of the long T1 species caused by repeated IR pulses in segmented IR-prepared sequences (FIG. 12B). Its severity depends, in large part, on the time between successive IR pulses, as determined by the patient's RR interval and the trigger pulse. To quantify the ghosting severity, we measured the SNR in the artifact area (rectangle in FIG. 12A) and expressed it as a percentage where 100% corresponded to the suppression-off case. To assess the method's robustness towards a varying pre-delay time, we used pre-delays from 1300 ms to 2600 ms in increments of 100 ms and calculated the artifact SNR as above. The suppression module was evaluated in cardiac patients whose standard images demonstrated ghosting artifacts.

Figure 14A:
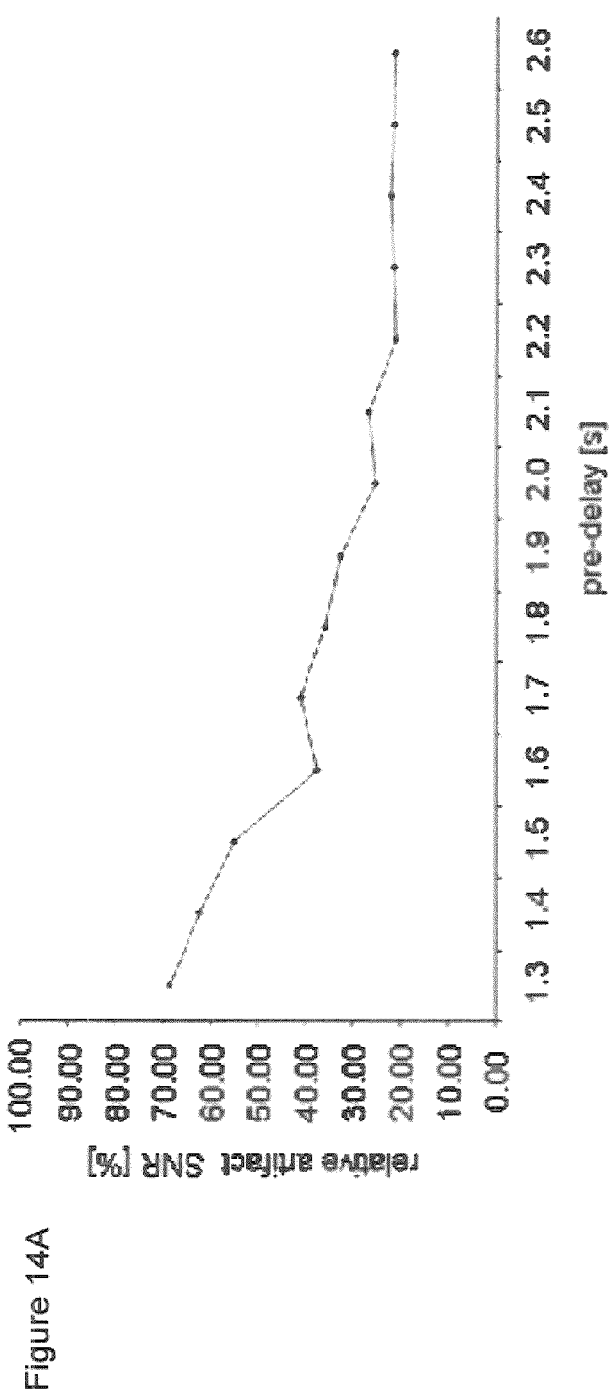
FIG. 14A shows exemplary illustrative relative artifact SNR as function of pre-delay (the artifacts are smallest over a broad range of pre-delays from 2200 ms to 2600 ms)
Figure 14C:
FIG. 14B-C show how ghosting in the right ventricular cavity resulting from CSF (FIG. 14B) can be completely eliminated by the artifact suppression module (predelay 2600 ms, FIG. 14C)
Figure 14B:
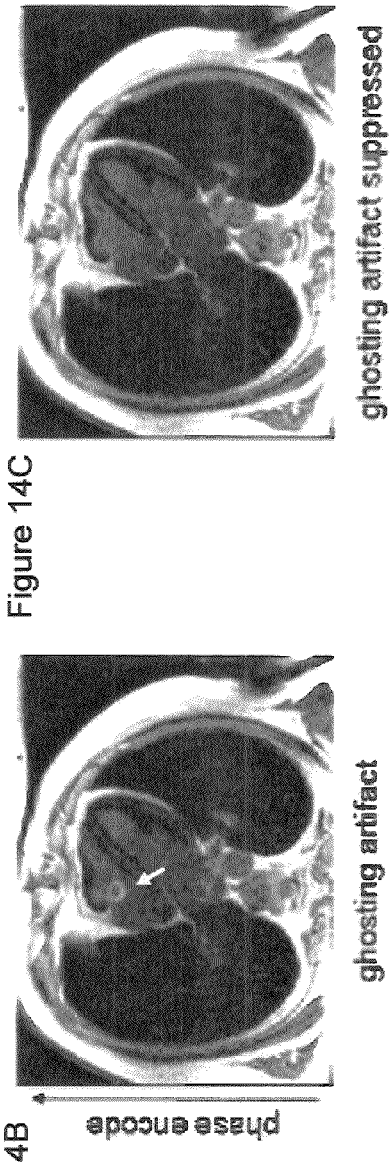

The artifacts clearly present in the image obtained with the standard sequence (FIGS. 12A-12C) are not visible when using the suppression module (FIG. 13A-13C). The relative artifact SNR for a 2600 ms pre-delay is 21% of the standard case. FIG. 14A shows the relative artifact SNR as function of the pre-delay. The artifacts are smallest over a broad range of pre-delays from 2200 ms to 2600 ms. The ghosting in the right ventricular cavity resulting from CSF (in the spinal canal) (FIG. 14B) is completely eliminated by the suppression module (predelay 2600 ms, FIG. 14C).

In phantom and in-vivo experiments playing a suppression module consisting of a non-selective inversion pulse and a pre-delay of 2200 ms to 2600 ms eliminates long-T1 species ghosting in segmented ECG-gated IR-prepared sequences without affecting the SNR of the myocardium. As artifacts due to multiple long-T1 species are suppressed using the same pre-delay, the ghosting can be eliminated without scanner operator involvement.

FIGS. 15A-15C show example non-limiting segmented inversion recovery TrueFisp images of a phantom with a circular long-T1 species (T1=2600 ms) compartment included in a bigger much shorter T1 compartment (T1=530 ms). The images are acquired a) without artifact suppression pre-pulse, b) with two dummy heart beats as done in the product, and c) and with the invented artifact suppression pre-pulse. The artifacts are severe in a), weaker yet still visible in b), and completely suppressed in c).

FIGS. 16A-1C show delayed enhancement images of a cardiac patient a) without artifact suppression pre-pulse, b) with two dummy heart beats as done in the product, and c) and with the invented artifact suppression pre-pulse. The artifacts are severe in a), weaker yet still visible in b), and completely suppressed in c).

FIGS. 17A-17B show delayed enhancement images of a cardiac patient without (left column) and with (right column) the invented artifact suppression technique (top row Flash, bottom row TrueFisp/SSFP sequence). The images obtained with the exemplary illustrative non-limiting technology herein have no ghosting artifacts and have an overall cleaner appearance than the standard images on the left.

While the technology herein has been described in connection with exemplary illustrative non-limiting embodiments, the exemplary illustrative non-limiting implementation is not to be limited by the disclosure. For example, although the example techniques herein have been described in connection with cardiac MRI, long-T1 species occur throughout the human body and the techniques are therefore applicable to MRI of any body region. CSF e.g. is abundant around the brain and spine. For example, in any instance where the sequence following the artifact suppression module is a segmented sequence, and data acquisition occurs repeatedly at periodic time points, it is irrelevant how the acquisition's periodicity is achieved. Periodicity can be created by a fixed time period between adjacent acquisitions or by gating to the ECG, to a finger pulse (pulse oxymetry), to the position of the diaphragm (navigator gating), or by any other method. For the artifact to arise and suppression to properly occur, the acquisition period can vary during the acquisition for example as consequence of ECG gating to a fluctuating heart rate. In addition, even though it may be advantageous in practice to use a non-selective IR or SR prepulse, slab-selective or slice-selective preparations may also be useful in various contacts. Thus, the invention is intended to be defined by the claims and to cover all corresponding and equivalent arrangements whether or not specifically disclosed herein.

We claim:

1. A method of suppressing artifacts arising from tissue, fluids, or other long-T1 species with T1 larger than 1000 milliseconds when acquiring magnetic resonance data with a segmented image acquisition pulse sequence that assumes that magnetization is at steady state, said method including suppressing artifacts using an magnetic resonance imaging system by producing an artifact suppression module (ASM) before the segmented image acquisition sequence, the artifact suppression module comprising exactly one non-selective or volume-selective saturation recovery (SR) or inversion recovery (IR) pulse and a timed delay after this exactly one saturation recovery (SR) or inversion recovery (IR) pulse and the artifact suppression module being played before the beginning of the image acquisition sequence.

2. The method of claim 1 wherein said recovery pulse comprises a saturation recovery (SR) pulse.

3. The method of claim 1 wherein said recovery pulse comprises an inversion recovery (IR) pulse.

4. The method of claim 1 wherein the segmented image acquisition pulse sequence comprises a segmented inversion recovery sequence.

5. The method of claim 1 further including acquiring a series of singleshot images.

6. The method of claim 1 further including acquiring a data and a reference data set comprising phase sensitive inversion recovery (PSIR).

7. The method of claim 1 in which the segmented image acquisition pulse sequence uses a gradient echo (GRE) readout.

8. The method of claim 1 wherein the segmented pulse sequence uses a gradient- or RF spoiled gradient echo readout.

9. The method of claim 1 wherein the segmented pulse sequence uses a steady state free precession (SSFP) readout.

10. The method of claim 1 wherein the segmented pulse sequence uses a Turbo-spin echo (TSE) readout.

11. The method of claim 1 further including using a Cartesian, radial, elliptical, or echo planar 2D readout.

12. The method of claim 1 further including using a 3D readout.

13. The method of claim 1 wherein the inversion recovery (IR) pulse comprises a partial inversion recovery (PIR) pulse.

14. A method of suppressing artifacts arising from tissue, fluids, or other long-T1 species when acquiring magnetic resonance data with a segmented pulse sequence that assumes that magnetization is at steady state, said method including suppressing artifacts using a magnetic resonance imaging system by producing with the magnetic resonance imaging system an artifact suppression module (ASM) before the segmented sequence, the artifact suppression module comprising at least one selective, non-selective, or volume-selective suppression pulse and a timed delay before or after the suppression pulse and before an image acquisition sequence, and further including adjusting the timed delay in response to data representing the type of anatomical matter and associated magnetic resonance response data to be suppressed.

15. A method of suppressing artifacts arising from tissue, fluids, or other long-T1 species when acquiring magnetic resonance data with a segmented pulse sequence that assumes that magnetization is at steady state, said method including suppressing artifacts using a magnetic resonance imaging system by producing with the magnetic resonance imaging system an artifact suppression module (ASM) before the segmented sequence, the artifact suppression module comprising at least one selective, non-selective, or volume-selective suppression pulse and a timed delay before or after the suppression pulse and before an image acquisition sequence, and further including displaying an image element enabling a user to select the timed delay for suppression of artifacts arising from magnetic resonance signal from particular type of anatomical matter.

16. A method of suppressing artifacts arising from tissue, fluids, or other long-T1 species when acquiring magnetic resonance data with a segmented pulse sequence that assumes that magnetization is at steady state, said method including suppressing artifacts using a magnetic resonance imaging system by producing with the magnetic resonance imaging system an artifact suppression module (ASM) before the segmented sequence, the artifact suppression module comprising at least one selective, non-selective, or volume-selective suppression pulse and a timed delay before or after the suppression pulse and before an image acquisition sequence, and further including adaptive adjustment of the timed delay in response to type of anatomical matter to be suppressed.

17. A method of using a magnetic resonancy imaging system to suppress artifacts arising from tissue, fluids, or other matter with long T1 value with T1 larger than 1000 milliseconds when acquiring magnetic resonance data with a segmented image acquisition pulse sequence, comprising:
applying, with the magnetic resonance imaging system, an artifact suppression module (ASM) which
consists of exactly one non-selective or volume-selective saturation recovery or inversion recovery pulse and a timed delay after this exactly one non-selective or volume-selective saturation recovery or inversion recovery pulse and before the beginning of the segmented image acquisition pulse sequence to permit long T1 matter achieve steady state magnetization to the segmented pulse sequence to follow; and then
applying, with the magnetic resonance imaging system, said segmented pulse sequence to obtain substantially steady state magnetization at readout time.

18. The method of claim 17 wherein the artifact suppression module (ASM) is played immediately before the segmented image acquisition pulse sequence.

19. The method of claim 17 wherein the segmented pulse sequence comprises a segmented inversion recovery sequence.

20. The method of claim 17 further including acquiring a series of single-shot images.

21. The method of claim 17 further including acquiring a data and a reference data set comprising phase sensitive inversion recovery (PSIR).

22. The method of claim 17 further including using a gradient echo (GRE) readout.

23. The method of claim 17 further including using a gradient- or RF-spoiled gradient echo readout.

24. The method of claim 17 further including using a steady state free precession (SSFP) readout.

25. The method of claim 17 further including using a Turbo-spin echo (TSE) readout.

26. The method of claim 17 further including using a Cartesian, radial, elliptical, or echo planar 2D readout.

27. The method of claim 17 further including using a 3D readout.

28. The method of claim 17 wherein the inversion recovery (IR) pulse comprises a partial inversion recovery (PIR) pulse.

29. A magnetic resonance system for imaging tissue, fluids, or long TI matter with T1 larger than 1000 milliseconds while suppressing artifacts arising from non-steady state magnetization of said long-T1 matter during data acquisition, comprising:
a magnet that exposes said tissue, fluids, or other matter to a magnetic field;
a radio frequency transceiver that transmits radio frequency pulses into said tissue, fluids, or other matter and receives corresponding nuclear magnetic responses from said tissue, fluids, or other matter; and
a pulse sequencer that controls said radio frequency transceiver to (a) apply an artifact suppression module comprising exactly one non-selective or volume-selective saturation recovery (SR) or inversion recovery (IR) pulse and then waits a timed delay after this exactly one saturation recover (SR) or inversion recovery (IR) pulse before beginning a segmented image acquisition pulse sequence to permit long T1 matter to achieve steady state magnetization to the segmented image acquisition pulse sequence to follow; before (b) applying said segmented image acquisition pulse sequence to acquire an image at substantially steady state magnetization of said long-T1 matter.

30. The system of claim 29 wherein said artifact suppression module exactly one non-selective or volume-selective saturation recovery (SR) or inversion recovery (IR) pulse comprises an inversion recovery pulse (IR).

31. The system of claim 29 wherein said artifact suppression module exactly one non-selective or volume-selective saturation recovery (SR) or inversion recovery (IR) pulse comprises a partial inversion recovery pulse (PIR).

32. The system of claim 29 wherein said artifact suppression module exactly one non-selective or volume-selective saturation recovery (SR) or inversion recovery (IR) pulse comprises a non-selective saturation recovery (SR) pulse.

33. The system of claim 29 wherein said artifact suppression module exactly one non-selective or volume-selective saturation recovery (SR) or inversion recovery (IR) pulse comprises a saturation recovery pulse (SR).

34. An MR imaging method including long T1 artifact suppression for long-T1 species with T1 larger than 1000 milliseconds, comprising:
using a magnetic resonance imaging system, before the beginning of a segmented image acquisition sequence, applying artifact suppression to a subject to be imaged including a exactly one non-selective or volume-selective saturation recovery (SR) or inversion recovery (IR) pulse and a delay time timed to match steady state magnetization of a portion of the subject to the segmented image acquisition pulse sequence to follow; then
applying, with the magnetic resonance imaging system, said segmented image acquisition pulse sequence to achieve substantially steady state magnetization at readout time; then
performing, with the magnetic resonance imaging system, an NMR readout operation; and generating an image of said subject based on said readout operation.

35. A method of suppressing artifacts arising from tissue, fluids, or other long-T1 species with T1 larger than 1000 milliseconds when acquiring magnetic resonance data with a segmented image acquisition pulse sequence that assumes that magnetization is at steady state, said method including suppressing artifacts by using a magnetic resonance imaging system to produce an artifact suppression module (ASM) before the segmented image acquisition sequence, the artifact suppression module comprising exactly one non-selective or volume-selective saturation recovery (SR) or inversion recovery (IR) pulse and a timed delay after this exactly one saturation recovery (SR) or inversion recovery (IR) pulse and before the beginning of the image acquisition sequence.

36. The method of claim 35 wherein the artifact suppression module comprises an inversion recovery (IR) or partial inversion recovery (PIR) pulse.

37. The method of claim 35 further including acquiring a data and a reference data set comprising phase sensitive inversion recovery (PSIR).

38. The method of claim 35 in which the segmented pulse sequence uses a gradient echo (GRE) readout.

39. The method of claim 35 wherein the segmented pulse sequence uses a gradient- or RF spoiled gradient echo readout.

40. The method of claim 35 wherein the segmented pulse sequence uses a steady state free precession (SSFP) readout.

41. The method of claim 35 wherein the segmented pulse sequence uses a Turbo-spin echo (TSE) readout.

42. The method of claim 35 further including using a Cartesian, radial, elliptical, or echo planar 2D readout.

43. The method of claim 35 further including using a 3D readout.

* * * * *